(12) United States Patent
McDaniel et al.

(10) Patent No.: US 11,168,225 B2
(45) Date of Patent: Nov. 9, 2021

(54) COLORLESS LUMINESCENT SOLAR CONCENTRATORS USING COLLOIDAL SEMICONDUCTOR NANOCRYSTALS

(71) Applicant: Los Alamos National Security, LLC, Los Alamos, NM (US)

(72) Inventors: Hunter McDaniel, Los Alamos, NM (US); Victor I. Klimov, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 16/047,652

(22) Filed: Jul. 27, 2018

(65) Prior Publication Data
US 2019/0051779 A1 Feb. 14, 2019

Related U.S. Application Data

(63) Continuation of application No. 15/192,562, filed on Jun. 24, 2016, now abandoned.
(Continued)

(51) Int. Cl.
*H02N 6/00* (2006.01)
*H01L 31/042* (2014.01)
(Continued)

(52) U.S. Cl.
CPC .............. *C09D 7/62* (2018.01); *C03C 17/009* (2013.01); *C08K 3/013* (2018.01); *C09K 11/025* (2013.01);
(Continued)

(58) Field of Classification Search
CPC .............. H01L 31/0468; H01L 31/055; H01L 31/0547; C09K 11/025; C09K 11/621;
(Continued)

(56) References Cited

U.S. PATENT DOCUMENTS 5,777,433 A 7/1998 Lester et al.
7,226,953 B1 6/2007 Petruska et al.
(Continued)

FOREIGN PATENT DOCUMENTS

WO WO 2004/008550 1/2004
WO WO 2012/163976 12/2012

OTHER PUBLICATIONS

Panthani et al., "In Vivo Whole Animal Fluorescence Imaging of a Microparticle-Based Oral Vaccine Containing (CuInSexS2—x)/ZnS Core/Shell Quantum Dots," Nanoletters 2013, 13, 4294-4298. (Year: 2013).*
(Continued)

*Primary Examiner* — Angelo Trivisonno
(74) *Attorney, Agent, or Firm* — Klarquist Sparkman, LLP

(57) ABSTRACT

Disclosed herein are embodiments of a composition comprising a polymer or sol-gel and one or more nanocrystals. The composition is useful as a luminescent solar concentrator. The nanocrystals are dispersed in the polymer or sol-gel matrix so as to reduce or substantially prevent nanocrystal-to-nanocrystal energy transfer and a subsequent reduction in the emission efficiency of the composition. In some embodiments, the polymer matrix comprises an acrylate polymer. Also disclosed herein is a method for making the composition. Devices comprising the composition are disclosed. In some cases the polymer is the waveguide, in others the polymer is applied as a coating on a waveguide. In some examples, the device is a window.

20 Claims, 22 Drawing Sheets
(18 of 22 Drawing Sheet(s) Filed in Color)

Related U.S. Application Data

(60) Provisional application No. 62/185,414, filed on Jun. 26, 2015, provisional application No. 62/191,853, filed on Jul. 13, 2015.

(51) Int. Cl.

| | |
|---|---|
| C09D 7/62 | (2018.01) |
| H01L 31/0468 | (2014.01) |
| C09K 11/02 | (2006.01) |
| C09K 11/88 | (2006.01) |
| C09K 11/62 | (2006.01) |
| H01L 31/054 | (2014.01) |
| H01L 31/055 | (2014.01) |
| C08K 3/013 | (2018.01) |
| C03C 17/00 | (2006.01) |
| B82Y 20/00 | (2011.01) |
| C08K 9/10 | (2006.01) |
| B82Y 30/00 | (2011.01) |

(52) U.S. Cl.
CPC .......... *C09K 11/621* (2013.01); *C09K 11/881* (2013.01); *H01L 31/0468* (2014.12); *H01L 31/055* (2013.01); *H01L 31/0547* (2014.12); B82Y 20/00 (2013.01); B82Y 30/00 (2013.01); C03C 2217/445 (2013.01); C03C 2217/475 (2013.01); C03C 2217/48 (2013.01); C08K 9/10 (2013.01); C08K 2201/001 (2013.01); C08K 2201/011 (2013.01); Y02E 10/52 (2013.01); Y10S 977/774 (2013.01); Y10S 977/783 (2013.01); Y10S 977/948 (2013.01)

(58) Field of Classification Search
CPC ...... C09K 11/881; C09D 7/1225; C09D 5/32; B82Y 30/00; B82Y 20/00; C08K 9/10; C08K 2201/001; Y10S 977/774; Y10S 977/948; Y10S 977/783
USPC .................................................. 136/247, 257
See application file for complete search history.

(56) References Cited

U.S. PATENT DOCUMENTS

| | | | |
|---|---|---|---|
| 7,723,394 B2 | 5/2010 | Klimov et al. | |
| 7,892,519 B2 | 2/2011 | Pak et al. | |
| 7,955,586 B2 | 6/2011 | Jung et al. | |
| 8,198,336 B2 | 6/2012 | Petruska et al. | |
| 2005/0107478 A1 | 5/2005 | Klimov et al. | |
| 2006/0107993 A1* | 5/2006 | Wilhelm Krokoszinski et al. ...... | B82Y 10/00 136/247 |
| 2008/0149164 A1* | 6/2008 | Goedmakers ......... | C08L 69/005 136/247 |
| 2010/0013376 A1 | 1/2010 | Maskaly et al. | |
| 2010/0276638 A1 | 11/2010 | Liu et al. | |
| 2011/0114174 A1* | 5/2011 | Rennig ................. | H01L 31/055 136/257 |
| 2012/0222723 A1* | 9/2012 | Mayer ................... | H01L 31/055 136/247 |
| 2013/0134366 A1 | 5/2013 | Battaglia et al. | |
| 2014/0130864 A1* | 5/2014 | Lunt ........................ | E06B 3/66 136/259 |

OTHER PUBLICATIONS

Panthani et al., "In Vivo Whole Animal Fluorescence Imaging of a Microparticle-Based Oral Vaccine Containing (CuInSexS2—x)/ZnS Core/Shell Quantum Dots," Nanoletters 2013, 13, 4294-4298. Supporting Information. (Year: 2013).*
Draguta et al., "Tuning Carrier Mobilities and Polarity of Charge Transport in Films of CuInSe$_x$S$_{2-x}$ Quantum Dots," *Advanced Materials* 27(10):1701-1705, Jan. 22, 2015.
International Search Report from International Application No. PCT/US2014/060303 dated Feb. 24, 2015.
Koo et al., "Synthesis of CuInSe$_2$ Nanocrystals with Trigonal Pyramidal Shape," *Journal of the American Chemical Society* 131(9):3134-3135, Feb. 13, 2009.
Li et al., "Efficient Synthesis of Highly Luminescent Copper Indium Sulfide-Based Core/Shell Nanocrystals with Surprisingly Long-Lived Emission," *Journal of the American Chemical Society* 133(5):1176-1179, Jan. 5, 2011.
Liu et al., "Alkylthiol-Enabled Se Powder Dissolution in Oleylamine at Room Temperature for the Phosphine-Free Synthesis of Copper-Based Quaternary Selenide Nanocrystals," *Journal of the American Chemical Society* 134(17):7207-7210, Apr. 19, 2012.
Makarov et al., "Photocharging Artifacts in Measurements of Electron Transfer in Quantum-Dot-Sensitized Mesoporous Titania Films," *Journal of Physical Chemical Letters* 5(1):111-118, Dec. 6, 2013.
McDaniel et al., "Engineered CuInSe$_x$S$_{2-x}$ Quantum Dots for Sensitized Solar Cells," *Journal of Physical Chemical Letters* 4(3):355-361, Jan. 8, 2013.
McDaniel et al., "An integrated approach to realizing high-performance liquid-junction quantum dot sensitized solar cells," *Nature Communications* vol. 4, Article No. 2887, pp. 1-10, Dec. 10, 2013.
McDaniel et al., "Simple yet Versatile Synthesis of CuInSe$_x$S$_{2-x}$ Quantum Dots for Sunlight Harvesting," *The Journal of Physical Chemistry* 118(30):16987-16994, Apr. 23, 2014.
O'Regan et al., "A low-cost, high-efficiency solar cell based on dye-sensitized colloidal TiO$_2$ films," *Nature* 353:737-740, Oct. 24, 1991.
Panthani et al., "Synthesis of CuInS$_2$, CuInSe$_2$, and Cu(In$_x$Ga$_{1-x}$)Se$_2$ (CIGS) Nanocrystals 'Inks' for Printable Photovoltaics," *Journal of the American Chemical Society* 130(49):16770-16777, Nov. 17, 2008.
Panthani et al., "In Vivo Whole Animal Fluorescence Imaging of a Microparticle-Based Oral Vaccine Containing (CuInSe$_x$Se$_{2-x}$)/ZnS Core/Shell Quantum Dots," *Nano Letters* 13(9):4294-4298, Sep. 11, 2013.
Robel et al., "Universal Size-Dependent Trend in Auger Recombination in Direct-Gap and Indirect-Gap Semiconductor Nanocrystals," *Physical Review Letters* 102(17):177404, May 1, 2009.
Stolle et al., "Comparison of the Photovoltaic Response of Oleylamine and Inorganic Ligand-Capped CuInSe$_2$ Nanocrystals," *ACS Applied Materials & Interfaces* 4(5):2757-2761, Apr. 23, 2012.
Stolle et al., "Nanocrystal photovoltaics: a review of recent progress," *Current Opinion in Chemical Engineering* 2:160-167, Apr. 3, 2013.
Tan et al., "Near-Band-Edge Electroluminescence from Heavy-Metal-Free Colloidal Quantum Dots," *Advanced Materials* 23(31):3553-3558, Jul. 6, 2011.
Turo et al., "Crystal-Bound vs Surface-Bound Thiols on Nanocrystals," *ACS Nano* 8(10):10205-10213, Sep. 15, 2014.
Wanger et al., "The Dominant Role of Exciton Quenching in PbS Quantum-Dot-Based Photovoltaic Devices," *Nano Letters* 13(12):5907-5912, Nov. 20, 2013.
Zhang et al., "Facile Synthesis of ZnS—CuInS$_2$-Alloyed Nanocrystals for a Color-Tunable Fluorochrome and Photocatalyst," *Inorganic Chemistry* 50(9):4065-4072, Apr. 1, 2011.
Zhong et al., "Tuning the Luminescence Properties of Colloidal I-III-VI Semiconductor Nanocrystals for Optoelectronics and Biotechnology Applications," *Journal of Physical Chemistry Letters* 3(21):3167-3175, Oct. 11, 2012.

* cited by examiner

A = photoluminescence; B = Absorption; C = photoluminescence excitation

COLORLESS LUMINESCENT SOLAR CONCENTRATORS USING COLLOIDAL SEMICONDUCTOR NANOCRYSTALS

CROSS REFERENCE TO RELATED APPLICATION

This application is a continuation of co-pending U.S. patent application Ser. No. 15/192,562, filed Jun. 24, 2016, which claims the benefit of, and priority to, the earlier filing dates of U.S. Provisional Application No. 62/185,414, filed on Jun. 26, 2015, and U.S. Provisional Application No. 62/191,853, filed on Jul. 13, 2015, the entirety of each of these prior applications is incorporated herein by reference.

ACKNOWLEDGMENT OF GOVERNMENT SUPPORT

This invention was made with government support under Contract No. DE-AC52-06NA25396 awarded by the U.S. Department of Energy. The government has certain rights in the invention.

FIELD

Certain disclosed embodiments concern a composition comprising heavy metal free semiconductor nanocrystals either dispersed in a transparent matrix, or applied as a coating, and a device and method for using the composition, such as a luminescence solar concentrator.

BACKGROUND

In the near future, building integrated photovoltaics (PV) could revolutionize urban architecture by allowing one to reach the ambitious goal of net zero energy consumption buildings. Luminescent solar concentrators (LSCs) can play an important role in this transition. For example, semi-transparent PV windows comprising LSCs could convert the energy passive facades of urban buildings into distributed energy generation units.

However, despite their large promise, wide use of LSCs has so far been hindered by the lack of suitable emitters. Typically used conjugated organic and organo-metallic fluorophores provide a limited coverage of the solar spectrum and suffer from significant optical losses associated with re-absorption of guided luminescence. For example, 4-dicyanomethyl-6-dimethylaminostiryl-4H-pyran (DCM), a large Stokes shift red-emitting LSC dye, has absorption onset at about 470 nm and thus does not harvest a significant fraction of the solar spectrum. The same limitation affects Europium organic complexes that emit at about 610 nm. Despite having completely suppressed self-absorption, they exhibit absorption spectra that are limited to the blue-green spectral region. Even top performing organic dyes such as BASF Lumogen RED, still exhibit a significant overlap between their absorption and emission spectra, leading to considerable losses to re-absorption over relatively short optical distances. These deficiencies reduce the light harvesting efficiency of LSCs and also lead to strong coloring of devices, which imposes certain constrains on their usage in architecture.

SUMMARY

Disclosed herein are embodiments of a substantially transparent composition. In some embodiments, the composition comprises a transparent matrix and plural, substantially non-aggregated heavy metal free nanocrystals substantially homogeneously dispersed in the transparent matrix and separated by a distance greater than an energy transfer distance. The transparent matrix may be a polymer matrix, a glass matrix, a sol-gel matrix, a solvent matrix or a combination thereof. In certain embodiments, the transparent matrix is a polymer matrix. In some embodiments, the transparent matrix stands on its own, in others the matrix is applied as a coating on a typical window material, such as on glass. In some embodiments, the heavy metal free nanocrystals do not comprise cadmium, and additionally, may not comprise mercury, arsenic or lead. The nanocrystals may have a shape selected from a sphere, rod, tetrapod, heteronanorod, hetero-platelet, hetero-tripod, hetero-tetrapod, hetero-hexapod, dot-in-rod, dot-in-platelet, rod-in-rod and platelet-in-platelet, dot-in-bulk, complex branched hetero-structure, or a combination thereof.

The nanocrystals may comprise a core and at least one shell. The nanocrystal core may have an intrinsically large Stokes shift, and the shell may not substantially affect the Stokes shift of the nanocrystal. The shell may comprise a shell material selected to enhance the stability of the core, to enable the nanocrystals to be dispersed in a matrix without substantially quenching the photoluminescence quantum yield of the nanocrystals, maintain or improve the photoluminescent intensity of the nanocrystal or a combination thereof.

The nanocrystal may comprise InSb, InP, Ge, Si, Sn, Sn, InN, AlN, GaN, ZnTe, ZnSe, ZnS, ZnO, $AgInSe_xS_{2-x}$, $AuInSe_xS_{2-x}$, $CuAlSe_xS_{2-x}$, $CuGaSe_xS_{2-x}$, or $CuInSe_xS_{2-x}$, where x is from 0 to 2, or from greater than 0 to less than 2, or combinations thereof. The nanocrystal may have a core comprising InSb, InP, Ge, Si, Sn, Sn, InN, AlN, GaN, ZnTe, ZnSe, ZnS, ZnO, $AgInSe_xS_{2-x}$, $AuInSe_xS_{2-x}$, $CuAlSe_xS_{2-x}$, $CuGaSe_xS_{2-x}$, $CuInSe_xS_{2-x}$, or combinations thereof, and/or a shell comprising InSb, InP, Ge, Si, Sn, Sn, InN, AlN, GaN, ZnTe, ZnSe, ZnS, ZnO, $AgInSe_xS_{2-x}$, $AuInSe_xS_{2-x}$, $CuAlSe_xS_{2-x}$, $CuGaSe_xS_{2-x}$, or combinations thereof. In some embodiments, the nanocrystal has a core/shell structure selected from InP/ZnSe, InSb/ZnSe, InP/ZnS, InSb/ZnS, Ge/Si, Si/Ge, Sn/Si, Si/Sn, Ge/Sn, Sn/Ge, $AgInSe_xS_{2-x}$/ZnS, $AuInSe_xS_{2-x}$/ZnS, $CuAlSe_xS_{2-x}$/ZnS, $CuGaSe_xS_{2-x}$/ZnS, $CuInSe_xS_{2-x}$/CuInS_2, $CuInSe_xS_{2-x}$/AuGaS_2, or $CuInSe_xS_{2-x}$/ZnS, where x is from 0 to 2, or from greater than 0 to less than 2.

The nanocrystal concentration in the transparent matrix may be from greater than zero wt % to 10 wt % relative to the weight of the transparent matrix, such as from greater than zero wt % to 0.5 wt %, or from 0.1 wt % to 0.2 wt %. The nanocrystals may be dispersed in the transparent matrix such that a nanocrystal emission efficiency drops by less than 10% compared to a emission efficiency of nanocrystals dissolved in a solvent, such as by less than 5%, by less than 1%, or approximately 0%.

The composition may comprise a transparent matrix that is substantially transparent to visible light, infrared (IR) light, ultraviolet (UV) light, or a combination thereof. The transparent matrix may be an acrylate polymer, such as polylauryl methacrylate. The composition may be substantially colorless, and in some embodiments, the composition has a color rendering index of from 80 to 100, such as from 90 to 100. The composition may absorb at least 10% of incident solar light, and/or may have an optical power conversion ratio of greater than 1%. In some embodiments, the composition has a Stokes shift of greater than 200 meV.

Also disclosed are embodiments of a device comprising the disclosed composition. The device may comprise a polymer matrix comprising the nanocrystals. Alternatively, or additionally, the device may comprise a transparent substrate at least partially covered with a film comprising the composition. The transparent substrate may be a glass substrate. The device may comprise a photovoltaic, a reflector, a diffuser or a combination thereof. The device may be a window, and may comprise at least one window pane comprising the disclosed composition. In some embodiments, the window comprises at least one window pane at least partially coated with a film comprising the composition, and/or may comprise at least two window panes with the composition positioned between the window panes.

A building or transportation device having at least one window comprising the composition is also disclosed. The transportation device may be an automobile, ship or airplane.

Embodiments of a method for making the composition are also disclosed. In some embodiments, the method comprises dispersing heavy metal free nanocrystals in a first amount of a monomer and a first polymerization initiator to form a dispersion of quantum dots in monomer and mixing the dispersion of quantum dots in monomer with a second amount of the monomer and an initiator to form a mixture. The mixture is then agitated, such as by stirring, sonicating, shaking, or a combination thereof, and polymerization of the monomer is initiated to form the composition comprising a transparent matrix with quantum dots dispersed within. The polymerization may proceed in the dark. The initiator may be a radical initiator and initiating polymerization may comprise irradiating the mixture with light. In some embodiments, the initiator is 2,2-dimethoxy-1,2-diphenylethan-1-one. The mixture may also comprise a cross-linking agent, which may comprise ethylene glycol dimethacrylate.

The foregoing and other objects, features, and advantages of the invention will become more apparent from the following detailed description, which proceeds with reference to the accompanying figures.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2A is 4-dicyanomethyl-6-dimethylaminostiryl-4H-pyran (DCM); FIG. 2B is BASF Lumogen red; FIG. 2C is europium tris(2-thenoyl trifluoro acetonate)-di(triphenylphosphine oxide) (Eu(TTA)$_3$(TPPO)$_2$); FIG. 2D is yellow emitting Crs040 Dye from Radiant Color; FIG. 2E is a perylene perinone dye; and FIG. 2F is CdSe/CdS core shell hetero-QD (shell comprises 14 CdS monolayers).

DETAILED DESCRIPTION

I. Definitions

Figure 1:
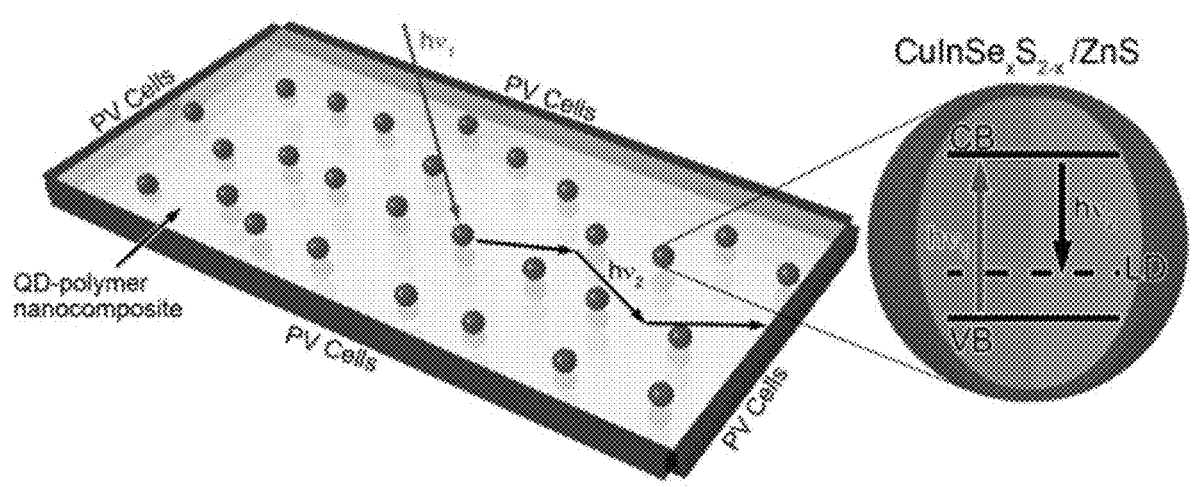
FIG. 1 is a schematic representation of an exemplary neutral density LSC comprising a polymer matrix incorporating ZnS-coated CISeS quantum dots (QDs).
Figure 2:
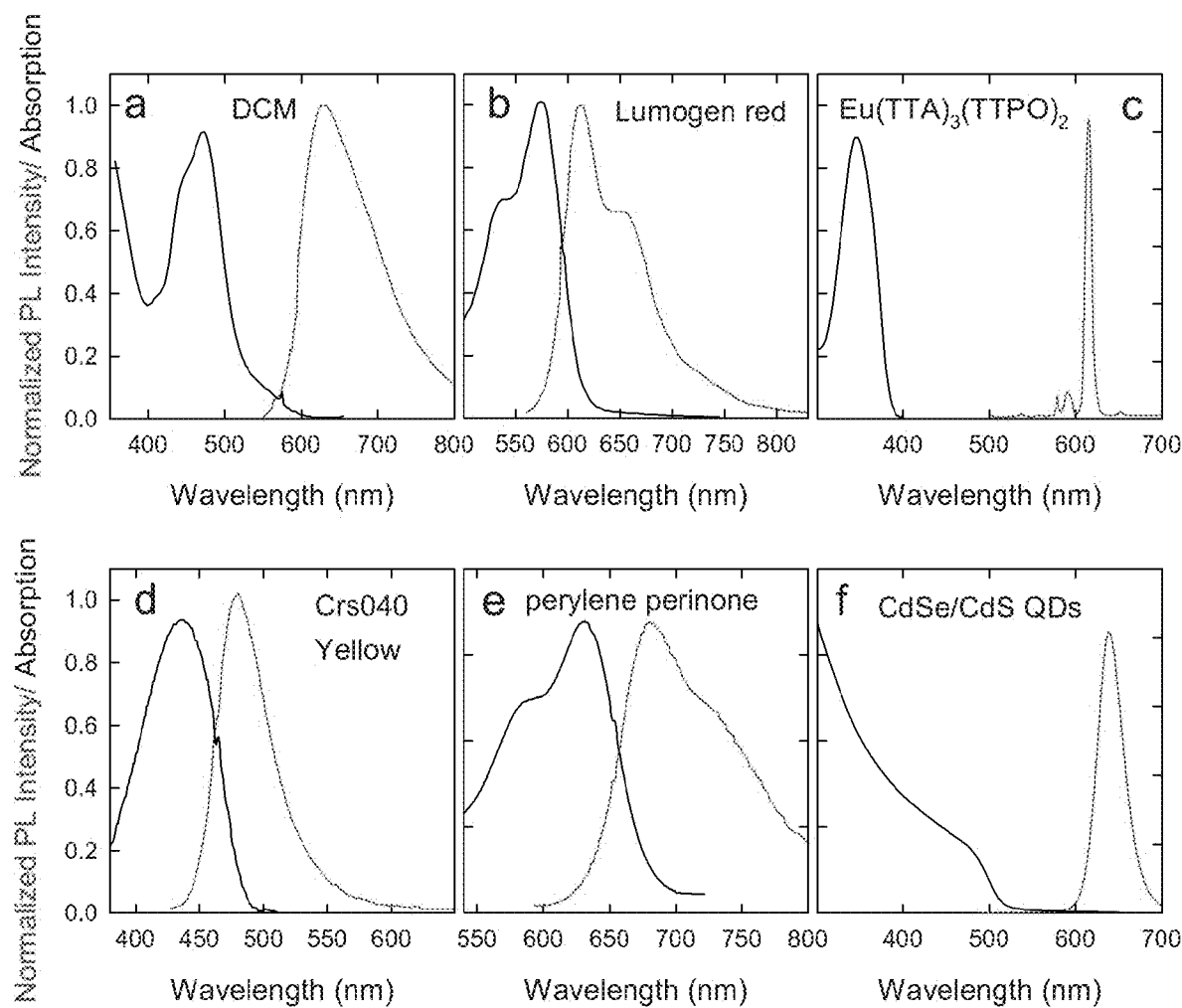
FIGS. 2A-2F are optical absorption and photoluminescence spectra of some organic dyes in comparison to CdSe/CdS QDs.

The following explanations of terms and methods are provided to better describe the present disclosure and to guide those of ordinary skill in the art in the practice of the present disclosure. The singular forms "a," "an," and "the" refer to one or more than one, unless the context clearly dictates otherwise. The term "or" refers to a single element of stated alternative elements or a combination of two or more elements, unless the context clearly indicates otherwise. As used herein, "comprises" means "includes." Thus, "comprising A or B," means "including A, B, or A and B," without excluding additional elements. All references, including patents and patent applications cited herein, are incorporated by reference.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that may depend on the desired properties sought and/or limits of detection under standard test conditions/methods. When directly and explicitly distinguishing embodiments from discussed prior art, the embodiment numbers are not approximates unless the word "about" is recited.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting.

As used herein, "heavy metal" refers to toxic elements selected from the group consisting of arsenic, cadmium, lead, and mercury.

As used herein, "alkyl" refers to a straight (i.e., unbranched), branched or cyclic saturated hydrocarbon chain. Unless expressly stated otherwise, an alkyl group contains from one to at least twenty-five carbon atoms ($C_1$-$C_{25}$); for example, from one to fifteen ($C_1$-$C_{15}$), from one to ten ($C_1$-$C_{10}$), from one to six ($C_1$-$C_6$), or from one to four ($C_1$-$C_4$) carbon atoms. A cycloalkyl contains from three to at least twenty-five carbon atoms ($C_1$-$C_{25}$); for example, from three to fifteen ($C_1$-$C_{15}$), from three to ten ($C_1$-$C_{10}$), from three to six ($C_1$-$C_6$). The term "lower alkyl" refers to an alkyl group comprising from one to ten carbon atoms or three to ten for a cycloalkyl. Unless expressly referred to as "unsubstituted alkyl," an alkyl group can either be substituted or unsubstituted. Examples of alkyl groups include, but are not limited to, groups such as methyl, ethyl, n-propyl, isopropyl, n-butyl, t-butyl, isobutyl, sec-butyl, homologs and isomers of, for example, n-pentyl, n-hexyl, n-heptyl, n-octyl, n-nonyl, n-decyl, n-dodecyl (lauryl) and the like. Examples of cycloalkyl groups include, but are not limited to, cyclopropyl, cyclobutyl, cyclopentyl, cyclohexyl and the like.

II. Overview

An LSC typically comprises a glass or plastic waveguide coated or doped with highly emissive fluorophores. Direct and diffused sunlight is absorbed by a fluorophore and re-emitted at a longer wavelength. The luminescence propagates to the waveguide edges by total internal reflection and is converted into electricity by high-efficiency PV cells installed along the slab perimeter (FIG. 1). Since the surface of the slab exposed to sunlight can be much larger than the surface of its edges, the LSC effectively increases the photon density incident onto the PV cell, which can boost its photocurrent. In FIG. 1 a simplified structure of band-edge electronic states in CISeS QDs responsible for light emission and absorption is illustrated. Light absorption is dominated by optical transitions involving intrinsic quantized states (the band-edge transition is shown by the arrow from VB to CB) while emission involves a band-edge electron state and an intra-gap hole state (CB to D arrow), which results in a large Stokes shift.

By matching the emission wavelength of active chromophores to the spectral peak of the external quantum efficiency (EQE), a further increase in the power output of the PV devices can be achieved. The color and the degree of transparency of an LSC, which are defined by the type and the concentration of the fluorophores, can be selected according to specific building requirements and/or aesthetic criteria.

Conjugated organic and organo-metallic fluorophores typically provide a limited coverage of the solar spectrum and often suffer from significant optical losses associated with re-absorption of guided luminescence. And organic dyes such as BASF Lumogen RED still exhibit significant losses to re-absorption over relatively short optical distances, possibly due to the significant overlap between their absorption and emission spectra (FIGS. 2A-2F). Colloidal or nanocrystal quantum dots (QDs) can help overcome these limitations. Colloidal or nanocrystal quantum dots feature near unity photoluminescence (PL) quantum yields ($\Phi_{PL}$) and narrow, widely tunable emission spectra that can be readily matched to various solar cells including both single- and multi-junction devices. Optimization of $\Phi_{PL}$ alone is however insufficient for realizing highly efficient LSCs. Another advantageous parameter of LSC fluorophores is the spectral overlap between the emission peak and the absorption spectrum. It determines the magnitude of intrinsic optical losses in devices as attenuation of re-emitted radiation occurs primarily due to "randomization" of the direction of propagating photons and thus increased losses through the "escape" cone following each re-absorption/reemission event. This ultimately results in strong device-size dependence of the LSC optical efficiency.

An attractive feature of the QDs is that they can be engineered to provide a large Stokes shift. A large Stokes shift can result in a large reduction in the overlap between optical absorption and emission spectra, which can be useful in the realization of large area LSCs with suppressed re-absorption losses. Recently, several strategies for increasing Stokes shift have been demonstrated in the literature. One approach involves the use of thick-shell CdSe/CdS QDs in which a large-volume CdS shell serves as a light-harvesting antenna while a core of a narrower gap CdSe as a lower-energy emitter. These structures exhibit a wide spectral separation between the absorption onset and the emission spectrum (about 400 meV) which allowed for the realization of prototype large-area LSCs with no re-absorption losses over distances of tens of centimeters. A similarly large Stokes shift can be obtained using other types of CdSe/CdS heterostructures such as CdSe/CdS seeded nanorods that were used to demonstrate direct integration of ultrathin, transfer-printed Si solar cells into an LCS. Another strategy for obtaining a large Stokes shift utilizes doping of QDs with transition metal ions that act as intragap radiative recombination centers excited via light absorption in the semiconductor host. And re-absorption-free transparent QD-LSCs were recently fabricated using Mn-doped ZnSe QDs.

However, despite their great potential, LSCs fabricated using CdSe/CdS heterostructures or doped ZnSe QDs suffer from incomplete coverage of the solar spectrum due to a large energy gap of the absorber material (2.46 eV for CdS and 2.7 for ZnSe) that may also lead to strong coloring of devices. In the case of core/shell structures, this problem could potentially be mitigated by employing recently demonstrated giant-shell PbSe/CdSe QDs that feature a lowered absorption onset (about 1.75 eV) and near-infrared (IR) luminescence characterized by a large effective Stokes shift. These structures, however, contain hazardous heavy metal ions and thus require expensive disposal/recycling protocols, a problem which is similar to one encountered with CdSe/CdS nanocrystals.

The compositions disclosed herein comprise heavy metal-free QDs that provide a large, hundreds of meV Stokes shift without the need for heterostructuring. These QDs are ternary I-III-VI$_2$ semiconductors such as CuInS$_2$ (CIS), CuInSe$_2$ (CISe), and their alloys (CuInSe$_x$S$_{2-x}$ or CISeS). Another attractive feature of these QDs is that they can be fabricated in large quantities via high-throughput, non-injection techniques using inexpensive precursors. Furthermore, their large absorption cross-sections and a spectrally tunable, near-IR absorption onset are well suited for harvesting solar radiation. Recently, ternary I—III-VI$_2$ QDs have been used to demonstrate high-efficiency QD-sensitized solar cells, which exemplifies how low-toxicity alternatives can outperform toxic QDs. They are also highly efficient, tunable emitters and their PL quantum yields can be pushed to above 80% using surface treatment with Cd$^{2+}$ ions or inorganic passivation with an outer shell of wide-gap ZnS.

III. Composition

Disclosed herein are embodiments of a composition comprising a transparent matrix and a plurality of semiconductor nanocrystals. In some embodiments, the composition is at least partially transparent to light, such as visible light, infrared (IR) light, ultraviolet (UV) light or combinations thereof, and may be substantially transparent to the light. The transparent matrix can be any matrix suitable to disperse the nanocrystals, and may be a polymer matrix, a glass matrix, a sol-gel matrix, a solvent matrix or a combination thereof.

A. Heavy Metal Free Semiconductor Nanocrystals

Semiconductor nanocrystals are crystalline particles of different shapes (spheres, cubes, rods, plates, branched structures such as tripods and tetrapods, etc.) that are sufficiently small to exhibit quantum mechanical properties. Nanocrystals may have different shapes including almost spherical particles (often referred to as "quantum dots" or "QDs"), elongated particles (known as "nanorods" or "quantum rods"), two-dimensional nanoplatelets, or complex branched structures such as tripods, tetrapods, pentapods, etc. The nanocrystals may comprise more than one semiconductor material. The nanocrystals may be heavy metal free nanocrystals. In some examples, heavy metal free nanocrystals do not comprise toxic heavy metals. In some embodiments, heavy metal free nanocrystals do not comprise cadmium. In other embodiments, heavy metal free nanocrystals do not comprise cadmium, mercury, arsenic or lead.

In some embodiments, the nanocrystals are colloidal nanocrystals. The nanocrystals may comprise a core and one or more shells enclosing the core. In alternative embodiments, the nanocrystals do not comprise a shell enclosing the core. The core and optional one or more shells may be made from the same or different materials. In certain embodiments, the nanocrystals comprise a core comprising a core material and a shell comprising a shell material. In some examples, the quantum dots further comprise at least a second shell comprising the same shell material or a second shell material. The core and optional shell(s) materials can be selected so as to produce quantum dots with specifically desired properties, such as a global Stokes-shift in a particular desired range, such as greater than 50 meV, greater than 100 meV, greater than 200 meV, greater than 300 meV, or greater than 400 meV.

In some embodiments, the core has an intrinsically large Stokes shift, such as a Stokes shift in the desired range, and the presence of the shell material, if present, does not substantially affect the Stokes shift of the nanocrystal. In certain embodiments, the nanocrystal comprises one or more shells comprising shell materials selected to enhance the stability of the core, to enable the nanocrystals to be dispersed in a matrix without substantially quenching the quantum yield of the nanocrystals, maintain or improve the photoluminescent intensity of the nanocrystal or a combination thereof.

In some embodiments, the colloidal nanocrystals include a core of a binary semiconductor material, e.g., a core of the formula MX, where M can be zinc, aluminum, tin, gallium, indium, thallium, magnesium, calcium, strontium, barium, copper, and mixtures or alloys thereof and X is sulfur, selenium, tellurium, nitrogen, phosphorus, antimony, and mixtures or alloys thereof. In other embodiments, the colloidal quantum dots include a core of a ternary semiconductor material, e.g., a core of the formula $M_1M_2X$, where $M_1$ and $M_2$ can be zinc, aluminum, tin, gallium, indium, thallium, magnesium, calcium, strontium, barium, copper, and mixtures or alloys thereof and X is sulfur, selenium, tellurium, nitrogen, phosphorus, antimony, and mixtures or alloys thereof. In alternative embodiments, the colloidal quantum dots include a core of a quaternary semiconductor material, e.g., a core of the formula $M_1M_2M_3X$, where $M_1$, $M_2$ and $M_3$ can be zinc, aluminum, tin, gallium, indium, thallium, magnesium, calcium, strontium, barium, copper, and mixtures or alloys thereof and X is sulfur, selenium, tellurium, nitrogen, phosphorus, antimony, and mixtures or alloys thereof. In other examples, the colloidal quantum dots include a core of a quaternary semiconductor material, e.g., a core of a formula such as $M_1X_1X_2$, $M_1M_2X_1X_2$, $M_1M_2M_3X_1X_2$, $M_1X_1X_2X_3$, $M_1M_2X_1X_2X_3$ or $M_1M_2M_3X_1X_2X_3$, where $M_1$, $M_2$ and $M_3$ can be zinc, aluminum, tin, gallium, indium, thallium, magnesium, calcium, strontium, barium, copper, and mixtures or alloys thereof and $X_1$, $X_2$ and $X_3$ can be sulfur, selenium, tellurium, nitrogen, phosphorus, antimony, and mixtures or alloys thereof. Examples include zinc sulfide (ZnS), zinc selenide (ZnSe), zinc telluride (ZnTe), aluminum nitride (AlN), aluminum sulfide (AlS), aluminum phosphide (AlP), aluminum antimonide (AlSb), gallium nitride (GaN), gallium phosphide (GaP), gallium antimonide (GaSb), indium nitride (InN), indium phosphide (InP), indium antimonide (InSb), thallium nitride (TlN), thallium phosphide (TlP), thallium antimonide (TlSb), indium gallium nitride (InGaN), indium gallium phosphide (InGaP), aluminum indium nitride (AlInN), indium aluminum phosphide (InAlP), aluminum gallium phosphide (AlGaP), aluminum indium gallium nitride (AlInGaN), silver indium selenide ($AgInSe_2$), gold indium sulfide ($AuInS_2$), copper aluminum selenide ($CuAlSe_2$), copper gallium selenide ($CuGaSe_2$), silver indium selenide sulfide ($AgInSe_xS_{2-x}$), gold indium selenide sulfide ($AuInSe_xS_{2-x}$), copper aluminum selenide sulfide ($CuAlSe_xS_{2-x}$), copper gallium selenide sulfide ($CuGaSe_xS_{2-x}$), copper indium selenide sulfide (CuInSeS), copper indium selenide ($CuInSe_2$), copper indium sulfide ($CuInS_2$) and the like, mixtures of such materials, or any other semiconductor or similar materials. The colloidal nanocrystal cores may be of silicon (Si), germanium (Ge), tin (Sn), and alloys thereof (e.g., $Sn_xSi_{1-x}$, $Sn_xGe_{1-x}$, or $Ge_xSi_{1-x}$, where x is from greater than 0 to less than 1), or may be oxides such as zinc oxide (ZnO), titanium oxide ($TiO_2$), silicon oxide ($SiO_2$), aluminum oxide ($Al_2O_3$), or zirconium oxide ($ZrO_2$) and the like. In another embodiment, the colloidal nanocrystal include a core of a metallic material such as gold (Au), silver (Ag), cobalt (Co), iron (Fe), nickel (Ni), copper (Cu), manganese (Mn), alloys thereof and alloy combinations. In other embodiments, the nanocrystal core comprises copper, indium, selenium, sulfur or combinations thereof. In certain embodiments, the nanocrystal core has a formula $CuInSe_xS_{2-x}$, where x is from 0 to 2, such as $CuInS_2$, $CuInSe_{0.1}S_{1.9}$, $CuInSe_{0.2}S_{1.8}$, $CuInSe_{0.25}S_{1.75}$, $CuInSe_{0.3}S_{1.7}$, $CuInSe_{0.4}S_{1.6}$, $CuInSe_{0.5}S_{1.5}$, $CuInSe_{0.6}S_{1.4}$, $CuInSe_{0.7}S_{1.3}$, $CuInSe_{0.75}S_{1.25}$, $CuInSe_{0.8}S_{1.2}$, $CuInSe_{0.9}S_{1.1}$, CuInSeS, $CuInSe_{1.1}S_{0.9}$, $CuInSe_{1.2}S_{0.8}$, $CuInSe_{1.25}S_{0.75}$, $CuInSe_{1.3}S_{0.7}$, $CuInSe_{1.4}S_{0.6}$, $CuInSe_{1.5}S_{0.5}$, $CuInSe_{1.6}S_{0.4}$, $CuInSe_{1.7}S_{0.3}$, $CuInSe_{1.75}S_{0.25}$, $CuInSe_{1.8}S_{0.2}$, $CuInSe_{1.9}S_{0.1}$, $CuInSe_2$ or a combination thereof. In certain embodiments, x is from greater than 0 to less than 2.

Additionally, the nanocrystals may comprise one or more shells about the core. The shells can also be a semiconductor material, and may have a composition different than the composition of the core. The shells can include materials selected from among Group II-VI compounds, Group II-V compounds, Group III-VI compounds, Group III-V compounds, Group IV-VI compounds, Group compounds, Group I-II-IV-VI compounds, Group I-II-III-VI, and Group IV compounds. Examples include zinc sulfide (ZnS), zinc selenide (ZnSe), zinc telluride (ZnTe), aluminum nitride (AlN), aluminum phosphide (AlP), aluminum antimonide (AlSb), gallium nitride (GaN), gallium phosphide (GaP), gallium antimonide (GaSb), indium nitride (InN), indium phosphide (InP), indium antimonide (InSb), thallium nitride (TlN), thallium phosphide (TlP), thallium antimonide (TlSb), zinc indium gallium nitride (InGaN), indium gallium phosphide (InGaP), aluminum indium nitride (AlInN), indium aluminum phosphide (InAlP), aluminum gallium phosphide (AlGaP), aluminum indium gallium nitride (AlInGaN), silicon and the like, mixtures of such materials, or any other semiconductor or similar materials.

In certain embodiments, the nanocrystals comprise InSb, InP, Ge, Si, Sn, Sn, InN, AlN, GaN, ZnTe, ZnSe, ZnS, ZnO or $CuInSe_xS_{2-x}$, where x is from 0 to 2, such as from greater than zero to less than 2. In some examples, the core material is InSb, InP, Ge, Si, Sn, Sn, InN, AlN, GaN, ZnTe, ZnSe, ZnS, ZnO, $CuInSe_xS_{2-x}$, where x is from 0 to 2, such as from greater than zero to less than 2, or combinations thereof, and the shell material is InSb, InP, Ge, Si, Sn, Sn, InN, AlN, GaN, ZnTe, ZnSe, ZnS, or ZnO or combinations thereof. In certain embodiments, the quantum dot has a core/shell structure selected from InP/ZnSe, InSb/ZnSe, InP/ZnS, InSb/ZnS, Ge/Si, Si/Ge, Sn/Si, Si/Sn, Ge/Sn, Sn/Ge, $AgInSe_xS_{2-x}$/ZnS, $AuInSe_xS_{2-x}$/ZnS, $CuAlSe_xS_{2-x}$/ZnS, $CuGaSe_xS_{2-x}$/ZnS, $CuInSe_xS_{2-x}$/$CuInS_2$, $CuInSe_xS_{2-x}$/$AuGaS_2$, or $CuInSe_xS_{2-x}$/ZnS, where x is from 0 to 2, or from greater than 0 to less than 2.

In some embodiments, the nanocrystals may comprise one shell, but in other embodiments, the nanocrystals comprise more than one shell, such as from 2 to 6 shells, or 2, 3, 4, 5 or 6 shells. Multiple shells can allow for additional tuning of the properties of the nanocrystal. Adjacent shells may be of differing materials.

The size of the shell in relation to the core can also be selected to enhance or decrease certain properties of the nanocrystal. The core may be small relative to the size of the shell, and the shell thick may be relative to the core. In some embodiments, the core has a radius of from 0.5 nm to 3 nm, such as from 1 nm to 2 nm. In certain embodiments, the core has a radius of 1.5 nm. The shell thickness is measured from the outer surface of the core to the outer surface of the nanocrystal. In some examples, the shell has a thickness of from greater than 0 nm to greater than 10 nm, such as from 0.5 nm to 8 nm, from 2 nm to 7 nm or from 3 nm to 6 nm.

Figure 3:
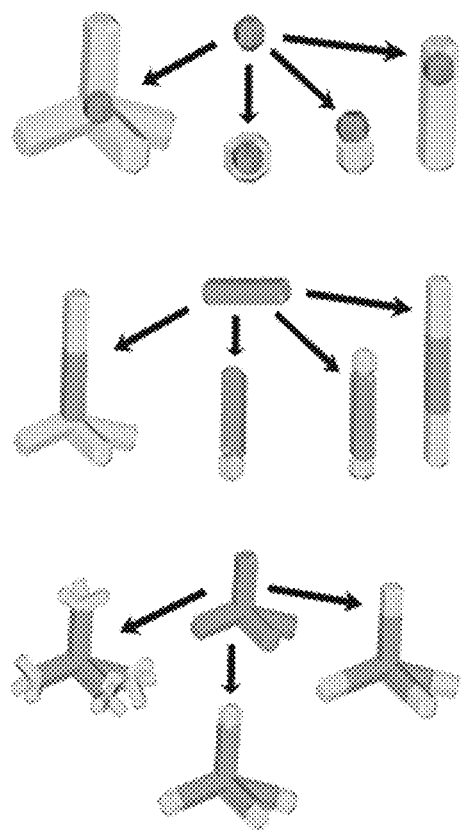
FIG. 3 is a schematic diagram illustrating some exemplary alternative geometries of hetero-structured nanocrystals.

In some embodiments, the nanocrystals are substantially spherical and in this case are often referred to as quantum dots, such as core/shell quantum dots. In other embodiments, the nanocrystals have different shapes, such as rods, tetrapods, heteronanorod, hetero-platelet, hetero-tripod, hetero-tetrapod, hetero-hexapod, dot-in-rod, dot-in-platelet, rod-in-rod and platelet-in-platelet, dot-in-bulk, complex branched heterostructures or more complex geometries (see FIG. 3 for some exemplary geometries). Further information regarding other possible geometries for heterostructured quantum dots can be found in C. d. M. Donega, *Synthesis and properties of colloidal heteronanocrystals*, Chemical Society Reviews, 2011, 40:1512-1546, which is incorporated herein by reference.

The nanocrystals can be made by any suitable method. One exemplary method can be found in McDaniel, H. et al., Simple yet versatile synthesis of $CuInSe_xS_{2-x}$ quantum dots for sunlight harvesting, *J. Phys. Chem. C*, 118 (30), 16987-16994 (2014), which is incorporated herein by reference. Briefly, copper(I) iodide and indium(III) acetate are dissolved in 1-dodecanethiol (DDT) and oleylamine (OLA) in a round-bottom flask, and the mixture is degassed under vacuum, with heat, such as from about 50° C. to about 120° C. The temperature is then raised to greater than 120° C. such as 140° C. until all solid precursors are fully dissolved, which usually takes less than 15 min. Separately, a solution of 1 M OLA/DDT-Se is made by mixing Se powder in OLA and DDT, in a ratio of 1 mmol Se:0.75 mL OLA:0.25 mL DDT, at room temperature under argon. The flask is then heated to 170-210° C. under argon, whereupon a desired amount of the OLA/DDT-Se solution is added dropwise such that the temperature of the reaction mixture does not vary by more than about 3° C. The temperature is maintained for 10 additional minutes to allow for QD nucleation (this step can be skipped for injections of ≤0.5 mL of OLA/DDT-Se), then the temperature is set to 230° C. for 1-60 min, dependent on the desired size (for instance, about 10 min for 3.5 nm QDs). The heating element is then removed and the QDs are allowed to cool. The resulting CISeS QDs are purified by iterative dissolution in chloroform and precipitation with methanol and then stored in chloroform, octane, or 1-octadecene under an inert atmosphere. The reaction is scalable and typically results in more than a 90% chemical yield of QDs (relative to Cu and In precursors).

An alternative exemplary method of making the nanocrystals comprises mixing a solution of QD cores in a suitable solvent, such as octadecene (ODE) and oleylamine. A suitable solvent is any solvent that will dissolve the QD cores. Exemplary solvents include, but are not limited to, hexane, toluene, chlorinated solvents such as chloroform and dichloromethane, THF, alcohols such as methanol, ethanol propanol and isopropanol, cyclohexane or combinations thereof. The mixture is then degassed. The degassing may take place at room temperature or at elevated temperatures. In some embodiments, the degassing is started at room temperature for a period of time, such as for 30 minutes to greater than 2 hours, or for 1 hour to 1.5 hours, and then the temperature is raised for a second period of time, such as from 50° C. to 150° C. or from 75° C. to 120° C. The degassing may continue at the elevated temperature for a sufficient period of time to remove the solvent and any water, such as for from 1 minute to greater than 30 minutes, or from 5 minutes to 15 minutes. In certain embodiments, the degassing continues at 100° C. for 5 minutes.

The solution is then stirred in an inert atmosphere, such as under nitrogen or argon, and the temperature is raised to above 300° C., such as from greater than 300° C. to 350° C., or from 305° C. to 315° C. In certain embodiments, the temperature is raised to above 310° C. At 200° C. a solution of metal-oleate in ODE and a separate solution of octanethiol dissolved in ODE are added slowly, such as at a rate of 2.5 mL per hour. After 2 hours a portion of oleic acid is added and after 4 hours a second portion of oleic acid is added. After 8 hours, the solution is stirred for an additional 15 minutes at about 310° C., and the heating is removed. The final product is recovered by precipitation, such as by the addition of acetone. By varying the amounts of the metal-oleate and octanethiol and the addition times, QDs of different desired shell-thicknesses can be produced.

Another alternative exemplary method can be found in Pietryga, J. M. et al. Utilizing the Lability of Metal Selenide to Produce heterostructured Nanocrystals with Bright, Stable Infrared Emission. *J. Am. Chem. Soc.* 130, 4879-4885 (2008). Briefly, large, nearly spherical $M_1Se$ nanocrystals (that is, $M_1Se$ QDs) with radii from 3.5 to 5 nm were fabricated, and then partial cation exchange was applied to create an outer $M_2Se$ shell of controlled thickness by exchanging ions of $M_1^{2+}$ with $M_2^{2+}$. Using a moderate reaction temperature (130° C.) the formation of homogeneous CdSe particles was avoided, and $M_1Se/M_2Se$ QDs of fairly uniform sizes were produced. This procedure preserved the overall size of the QDs and allowed the gradual tuning of the aspect ratio of the resulting core/shell structure ($\rho$), defined as the ratio of the shell thickness (H) to the total radius (R): $\rho=H/R$. Both the starting $M_1Se$ QDs and the final $M_1Se/M_2Se$ structures exhibited a nearly spherical shape and fairly narrow size dispersity (standard deviation of the overall size is approximately 7%). The core and shell sizes within a given sample appeared less uniform, exhibiting approximately 15% dispersion.

B. Polymer

In some embodiments, the transparent matrix comprises a polymer that is at least partially, and may be substantially, transparent to the light, such as visible light, IR light, UV light or combinations thereof. The transparent matrix may comprise a polymer suitable for processing into any desired form, such as a planar substrate or self-standing bulk material, a coating film such as for a coating on glass of plastic substrates, intercalated layer such as between two glass or plastic slabs, a fiber such as an optical fiber made of polymeric materials (plastic optical fiber) or a viscous fluid suitable for use in transparent packaging. In some embodiments, the transparent matrix is a polymer matrix suitable for use in a semi-transparent or substantially transparent window.

In some examples, the polymer matrix comprises a polymer selected from poly acrylate and poly acryl methacrylate, polyolefin, poly vinyl, epoxy resin (polyepoxide), polycarbonate, polyacetate, polyamide, polyurethane, polyketone, polyester, polycyanoacrylate, silicone, polyglycol, polyimide, fluorinated polymer, polycellulose, or poly oxazine. Exemplary polymers include, but are not limited to, polyethylene, polypropylene, polymethylpentene, polybutene-1, polyisobutylene, ethylene propylene rubber, ethylene propylene diene monomer rubber, polyvinyl chloride, polybutadiene, polystyrene, polyvinyl acetate, polyvinyl alcohol, polyacrylonitrile, bisphenol-A, bisphenol-F, polytetrafluoroethylene, polyvinylfluoride, polyvinylidene fluoride, polychlorotrifluoroethylene, ethylene-carbon monoxide co-polymer, polyglycolide, polylactic acid, polycaprolactone, polyhydroxyalkanoate, polyhydroxybutyrate, polyethylene adipate, polybutylene succinate, polyethylene glycol, methyl cellulose, hydroxyl methyl cellulose, polymethyl methacrylate, polymethyl acrylate, polyethyl acrylate, polylauryl methacrylate or combinations thereof.

In some embodiments, the polymer matrix comprises an acrylate polymer, and may be an alkyl acrylate polymer. The acrylate polymer may also be a substituted acrylate polymer, where one or more of the vinyl hydrogens in the monomer is replaced by one or more substituent groups. In some embodiments, the substituent group is an alkyl group, such as methyl, ethyl, propyl, isopropyl, or butyl. Exemplary acrylate monomers that can be used to form the polymers include, but are not limited to, methyl acrylate, ethyl acrylate, propyl acrylate, butyl acrylate, hexyl acrylate, heptyl acrylate, octyl acrylate, nonyl acrylate, decyl acrylate, undecyl acrylate, lauryl acrylate, dodecyl acrylate, stearyl acrylate, 2-chloroethyl acrylate, methyl methacrylate (MMA), ethyl methacrylate, butyl methacrylate, lauryl methacrylate, 2-ethylhexyl acrylate, hydroxyethyl methacrylate, or trimethylolpropane triacrylate (TMPTA). The acrylate or methacrylate monomer may be selected to provide long side chains, such as C6-C25 side chains, C8-C25 side chains or C10-C25 side chains. In some embodiments, the side chain group on the monomer is hexyl, heptyl, octyl, nonyl, decyl, undecyl, dodecyl, lauryl, tridecyl, tetradecyl, pentadecyl, hexadecyl, heptadecyl, octadecyl, nonadecyl, eicosyl, or a combination thereof. In particular embodiments, the polymer matrix is polylauryl methacrylate (PMMA), which provides side chains having a length of C12.

The polymer matrix may also comprise one or more cross-linking agents. A person of ordinary skill in the art will understand that the type of cross-linking agent may depend on the type of polymer being used. For example, a diacrylate cross-linking agent may be sued to cross link a polyacrylate polymer matrix. In some embodiments, the cross-linking agent is a diacrylate or dimethacrylate. The cross-linking agent may be an alkyl or alkyl oxide diacrylate or dimethacrylte, and in particular embodiments, the cross-linking agent is ethylene glycol dimethacrylate.

The nanocrystals may be dispersed in the polymer matrix. In some embodiments, the QDs are dispersed in the polymer matrix by a process that inhibits or substantially prevents aggregation of the nanocrystals. The dispersion may be such that an emission efficiency of the nanocrystals in the polymer matrix is substantially the same as the emission efficiency of the nanocrystals in a solution, such as a hexane solution. In some embodiments, the emission efficiency of the nanocrystals in the polymer matrix is at least 90% of the emission efficiency of the nanocrystals in a hexane solution, such as at least 95%, at least 98% or at least 99%.

In some embodiments, the nanocrystals are dispersed such that the average distance between the nanocrystals is greater than an energy transfer distance. Energy transfer between nanocrystals typically occurs at distances up to about 15-20 nm. Therefore, in certain embodiments, the average distance between the nanocrystals is greater than 15 nm, such as greater than 20 nm, greater than 25 nm or greater than 30 nm. In some embodiments, the concentration of nanocrystals in the polymer matrix is from greater than 0 to 10% relative to the weight of the polymer matrix, such as from greater than 0 to 5%, from greater than zero to 1% or from greater than zero to 0.5%. In certain embodiments, the concentration of nanocrystals in the polymer matrix is from 0.1% to 0.2%.

The composition may be a substantially colorless composition. In some embodiments, the composition has a color rendering index of greater than 80, such as from 80 to 100, from 85 to 100 or from 90 to 100. In other embodiments, the composition has a total error score from a Farnsworth-Munsell 100 hue color vision test of less than 100, such as from 0 to 90, from 0 to 80 or from 0 to 70, indicating an insignificant amount of color distortion being experienced by test subjects.

The composition may absorb at least 10%, or at least 20%, of the incident solar power. In some embodiments, the composition has an optical power conversion efficiency of greater than 1%, such as greater than 2%, or greater than 3%.

C. Sol-Gel

In some embodiments, the nanocrystals are mixed with a lower alcohol, a non-polar solvent and a sol-gel precursor material, and the resultant solution can be used to form a solid composition. For example, the solution can be deposited onto a suitable substrate to yield substantially homogeneous, solid compositions from the solution of nanocrystals and sol-gel precursor. "Homogeneous" means that the nanocrystals are substantially uniformly dispersed in the resultant product. In some instances, non-uniform dispersal of the nanocrystals is acceptable. In some embodiments of the invention, the solid compositions can be transparent or optically clear.

The lower alcohol used in this process is generally an alcohol containing from one to four carbon atoms, i.e., a $C_1$ to $C_4$ alcohol. Among the suitable alcohols are included methanol, ethanol, n-propanol, isopropanol, n-butanol, sec-butanol and t-butanol.

The non-polar solvent is used in the process to solubilize the nanocrystals and should be miscible with the lower alcohol. The non-polar solvent is generally chosen from among tetrahydrofuran, toluene, xylene and the like. Tetrahydrofuran is a preferred non-polar solvent in this process.

Sol-gel processes generally refer to the preparation of a ceramic material by preparation of a sol, gelation of the sol and removal of the solvent. Sol-gel processes are advantageous because they are relatively low-cost procedures and are capable of coating long lengths or irregularly shaped substrates. In forming the sol-gel based solution used in the processes of the present invention, suitable sol-gel precursor materials are mixed with the other components.

Additional information regarding Sol-gel processes can be found in Brinker et al., "Sol-Gel Science, The Physics and Chemistry of Sol-Gel Processing", Academic Press, 1990, which is incorporated herein by reference. Among suitable sol-gel precursor materials are included metal alkoxide compounds, metal halide compounds, metal hydroxide compounds, combinations thereof and the like where the metal is a cation from the group of silicon, titanium, zirconium, and aluminum. Other metal cations such as vanadium, iron, chromium, tin, tantalum and cerium may be used as well. Sol solutions can be spin-cast, dip-coated, printed or sprayed onto substrates in air. Sol solutions can also be cast into desired shapes by filling molds or cavities as well. Among the suitable metal alkoxide compounds can be included titanium tetrabutoxide (titanium (IV) butoxide), titanium tetraethoxide, titanium tetraisopropoxide, zirconium tetraisopropoxide, tetraethoxysilane (TEOS). Among suitable halide compounds can be included titanium tetrachloride, silicon tetrachloride, aluminum trichloride and the like.

The sol-gel based solutions generated in this process are highly processable. They can be used to form solid compositions in the shape of planar films and can be used to mold solid compositions of various other shapes and configurations. Volume fractions or loadings of the nanocrystals can been prepared as high as about 13 percent by volume and may be as high as up to about 30 percent by volume. Further, the first process of the present invention has allowed preparation of solid compositions with a refractive index of 1.9, such refractive index values being tunable.

In alternative embodiments, the process for incorporating nanocrystals into a sol-gel host matrix further comprises admixing the nanocrystals with a polymer. Typically this is done in a suitable solvent, such as a solvent that will dissolve the polymer. A person of ordinary skill in the art will understand that the nature of the solvent will depend on the polymer which needs to be dissolved. Suitable solvents include, but are not limited to, chlorinated solvents such as chloroform, dichloromethane, dichloroethane and tetrachloroethane. The polymer solution is then added to a solution of nanocrystals in a suitable solvent, such as chloroform. In some embodiments, the nanocrystals have been previously separated from their growth media, such as by precipitation. When sufficient polymer has been added such that the nanocrystals are soluble in an alcohol, such as ethanol, the solvent is evaporated. The nanocrystal/polymer mixture is dissolved in alcohol, typically in an inert atmosphere. In some instances where minor amounts of nanocrystal-polymer adduct or complex remained un-dissolved in the alcohol, a co-solvent such as tetrahydrofuran and the like is used with the alcohol to completely or nearly completely solubilize the adduct or complex. The solution is then mixed with a sol-gel precursor solution, e.g., a titania sol precursor material, and formed into a solid composite such as a film on a substrate. Once incorporated into the sol-gel matrix, the nanocrystals are highly stable and are not then soluble within hydrocarbon solvents such as hexane. The alcohols, used with the alcohol soluble colloidal nanocrystal-polymer adduct or complexes in the present invention, generally include ethanol, 1-propanol and 1-butanol. Other alcohols may be used as well, but alcohols having lower boiling points are preferred for improved processability with sol-gel precursors.

Additional information regarding the process of preparing a composition comprising quantum dots dispersed within a sol-gel host matrix can be found in U.S. Pat. Nos. 7,226,953, 7,723,394 and 8,198,336, which are incorporated herein by reference.

D. Solvent Matrices

In alternative embodiments, the nanocrystals are dispersed in a solvent matrix. The solvent can be any solvent suitable for solubilizing the nanocrystals. Suitable solvents include non-polar solvents, such as tetrahydrofuran, toluene, xylene and the like. The solvent may be a single solvent, or it may be a mixture of solvents. A composition comprising a solvent matrix may be used when the composition will be loaded into a space between two layers, typically transparent layers. Examples include, but are not limited to, loading the composition into the space between two panes of glass, such as two window panes.

IV. Method of Making the Composition

Also disclosed herein are embodiments of a method for making the composition. In some embodiments, the method comprises mixing the nanocrystals with a small volume of a monomer, and then mixing the resulting mixture with a larger volume of the monomer. One or more cross-linking agents and/or initiators may also be added. In some embodiments, the nanocrystals are mixed with the small volume of monomer for a time sufficient to wet the surfaces of the nanocrystals and/or allow for a fine dispersion of nanocrystals in the monomer to develop. Suitable cross-linking agents include any agent that can cross-link the polymer being made. A person of ordinary skill in the art will understand that the exact nature and amount of the cross-linking agent may depend on the monomer being used. In certain embodiments, an acrylate cross-linker is used, such as ethylene glycol dimethacrylate. The amount of cross-linking agent is selected to provide a desired amount of cross-linking in the resultant polymer. In some embodiments, the ratio of monomer to cross-linking agent is from less than 50%:50% wt/wt to greater than 99%:1% wt/wt, such as from 60%:40% wt/wt to 99%:1% wt/wt, from 75%:25% wt/wt to 95%:5% wt/wt or from 70%:30% wt/wt to 90%:10% wt/wt. In certain embodiments, the ratio of monomer to cross-linking agent is 80%:20% wt/wt.

An initiator may be used to facilitate polymerization of the monomer. The initiator can be any initiator suitable for the particular monomer being used. In some embodiments, the initiator is a radical photoinitiator. Suitable initiators include, but are not limited to, peroxides such as lauroyl peroxide, di-tert-butyl peroxide, benzoyl peroxide, methyl ethyl ketone peroxide, tert-butyl peracetate, tert-butyl hydroperoxide and acetone peroxide, azo compounds such as azobisisobutyronitrile (AIBN), 1,1'-azobis(cyclohexanecarbonitrile) (ABCN) and 4,4'-azobis(4-cyanovaleric acid) (ABVA), photoinitiators such as 2,2-dimethoxy-1,2-diphenylethan-1-one (IRGACURE® 651), persulfates such as potassium persulfate, sodium persulfate and ammonium persulfate, organometallics such as triethylaluminum and titanium tetrachloride, or combinations thereof. Sufficient initiator is added to the monomer to initiate the polymerization reaction. In some embodiments, the amount of initiator added to the monomer or monomers is from greater than 0 to greater than 5% wt/wt with respect to the monomer(s), such as from greater than 0 to 5% wt/wt, from 0.1% to 2.5% wt/wt, or from 0.5% to 1.5% wt/wt. In certain embodiments, 1% wt/wt initiator is added to the monomer(s).

After the nanocrystal/monomer mixture has been mixed with the larger volume of monomer, and any desired cross-linking agents and/or initiators added, the mixture is agitated to facilitate nanocrystal dispersion. Any suitable agitation can be used, such as stirring, sonication, shaking or any combination thereof. The agitation is continued until a suitable dispersion is formed. The mixture is then typically poured into a mold and polymerization is initiated. The polymerization can be initiated by any suitable technique, such as heating or irradiation, and may proceed in a light or a dark environment, and at an ambient temperature or an elevated or reduced temperature relative to the ambient temperature. A person of ordinary skill in the art will appreciate that the method of initiation may depend on the type of initiator used. In certain embodiments, the initiation was achieved by irradiation, such as UV irradiation. After polymerization is complete, the composition can be removed from the molds, shaped or cut in to a desired shape, and polished.

V. Applications

Figure 4:
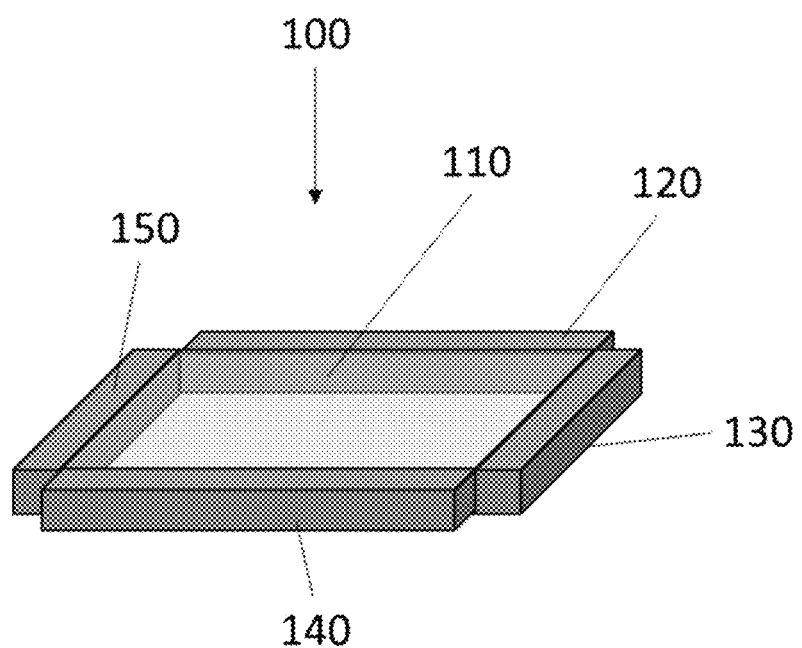
FIG. 4 is a schematic diagram of one embodiment of a luminescent solar concentrator.

The disclosed compositions can be used in a variety of applications and devices such as solar cells and other applications comprising photovoltaic cells. One exemplary embodiment of a device is schematically shown in FIG. 4. With reference to FIG. 4, device 100 comprises an LSC 110 comprising a composition as disclosed herein, comprising a transparent matrix and nanocrystals. The device 100 also comprises photovoltaic cells, with the exemplary illustrated embodiment comprising four photovoltaic cells 120, 130, 140 and 150. The composition receives incident light, such as from the sun, and some of that light is absorbed by the nanocrystals. The photovoltaic cells receive the luminescence emissions from the nanocrystals.

In alternative embodiments, one, two or three of the photovoltaic cells, 120, 130, 140 and 150 may be replaced with reflectors and/or diffusers, such as white or silvered reflectors, reflectors coated with aluminum or other metals, or multilayer stacks of dielectric layers to form distributed Bragg reflectors. The function of the reflector is to reflect light back into the composition and towards the photovoltaic cell(s). In some embodiments, the reflectors are diffuse reflectors.

In other examples, the LSC 110 may not be surrounded by photovoltaic cells and/or reflectors. In these examples, any edge that does not have a reflector or photovoltaic cell may allow light to escape, thereby reducing the overall efficiency of the device.

In some embodiments, the LSC 110 is transparent or semi-transparent, allowing the device to be used as a window. In such embodiments, the photovoltaic cells and reflectors and/or diffusers, if present, may be placed in the window frame. The window maybe of any suitable shape, such as a square or rectangle, circle, ellipse, triangle, pentagon, hexagon, octagon, arch, cross, star or an irregular shape. The window may be colored or colorless, tinted or not tinted, and in all possible combinations. In some embodiments, the window is two way, that is visible light can pass in both directions through the window pane. In other embodiments, the window is a 'one-way' window, thereby restricting the passage of visible light through the window. Ultraviolet and infrared light mat still be able to penetrate the window. In other embodiments, the window can be transparent in the visible and IR but strongly absorb UV light. In some embodiments, the window is in a building or in a transportation device, such as an automobile, ship or airplane.

VI. Examples

Materials

Lauryl methacrylate (LMA, 99%, Aldrich) and ethylene glycol dimethacrylate (EGDM, 98%, Aldrich), purified with basic activated alumina (Sigma-Aldrich), were used as monomers for the preparation of polymeric nanocomposites. IRGACURE® 651 (Sigma-Aldrich) was used as a photo-initiator without purification.

Synthesis of the QDs

The CIS and CISeS QDs used in this study were synthesized following the procedure described in McDaniel, H., Koposov, A. Y., Draguta, S., Makarov, N. S., Pietryga, J. M. & Klimov, V. I., Simple yet Versatile Synthesis of CuIn-$Se_xS_{2-x}$ Quantum Dots for Sunlight Harvesting. *J. Phys. Chem. C* 118, 16987-16994 (2014), which is incorporated herein by reference. Typically, copper (I) iodide and indium (III) acetate were dissolved in a mixture of 1-dodecanethiol (DDT) and oleylamine (OLA) in a round bottom flask, and the mixture was degassed for 30 minutes. For CISeS, a solution of 1 M OLA/DDT-Se was made separately by mixing selenium powder in OLA and DDT. The reaction flask was then heated to 230° C. for about 30 minutes, with OLA/DDT-Se added during heating for CISeS (otherwise, reaction was approximately the same for CIS). The resulting CISeS QDs were purified by iterative dissolution in chloroform and precipitation with methanol, and then stored in chloroform. For improved PL QY and stability, the QDs were exposed to a solution of zinc oleate at elevated temperature that formed a thin ZnS shell by cation exchange as described in McDaniel, H., Fuke, N., Makarov, N. S., Pietryga, J. M. & Klimov, V. I. An integrated approach to realizing high-performance liquid-junction quantum dot sensitized solar cells. *Nat. Commun.* 4 (2013), which is incorporated herein by reference.

Fabrication of the Nanocrystal-Polymer Composite

Initially, a QD powder was dispersed in a small volume of lauryl methacrylate monomer for 3 hours in order to wet the nanoparticle surface and enable a fine dispersion of the individual QDs to form. The monomer-QD mixture was then added to a large volume of lauryl methacrylate together with a secondary monomer, ethylene glycol dimethacrylate (EGDM; LMA:EGDM 80%:20% w/w), which acted as a cross-linking agent, and a radical photo-initiator (IRGACURE® 651; 1% w/w). After stirring the mixture for 20 minutes and sonication for 10 minutes to facilitate QDs dispersion, the homogeneous mixture was poured into a mold made of two low-roughness pieces of tempered glass linked by a PVC gasket, and irradiated with 365 nm light from a UV lamp for 5 minutes in order to trigger radical polymerization. The polymerization was then completed by keeping samples in dark for 30 minutes while leaving them in the mold in order to avoid creation of cracks. After the completion of the procedure, the slabs were removed from the mold, cut in pieces of desired sizes, and polished.

Application of a Nanocrystal-Polymer Composite Coating

The nanocrystal-polymer composites described above, or others, may be applied as a coating on top of a waveguiding material such as glass. The emission from the QDs couples into the glass due to the same or similar index of refraction of the coating and the glass. The glass may be more robust than the polymer itself and also have flatter surfaces, conduced for total internal reflection. Furthermore, the glass may have even greater transparency than the polymer such that it acts as a better light guide. Deployment of the coating embodiment may also be lower cost because it can be accomplished by spray deposition, dip coating, or other high throughput deposition approaches. The coating can be nanocrystals within many different types of initially liquid solutions including paint, polymer, nail polish, epoxy resin, silicone, sol-gels, or others.

Characterization of the Polymeric Nanocomposite

Differential scanning calorimetry measurements were performed by using a Mettler Toledo Star® thermal analysis system. The thermal program was characterized by three ramps: the first step of heating from 0° C. to 200° C. at 10° C. per minute, followed by the step of cooling from 200° C. to 0° C. at −10° C. per minute, and the final step of heating from 0° C. to 200° C. at 10° C. per minute.

Figure 5:
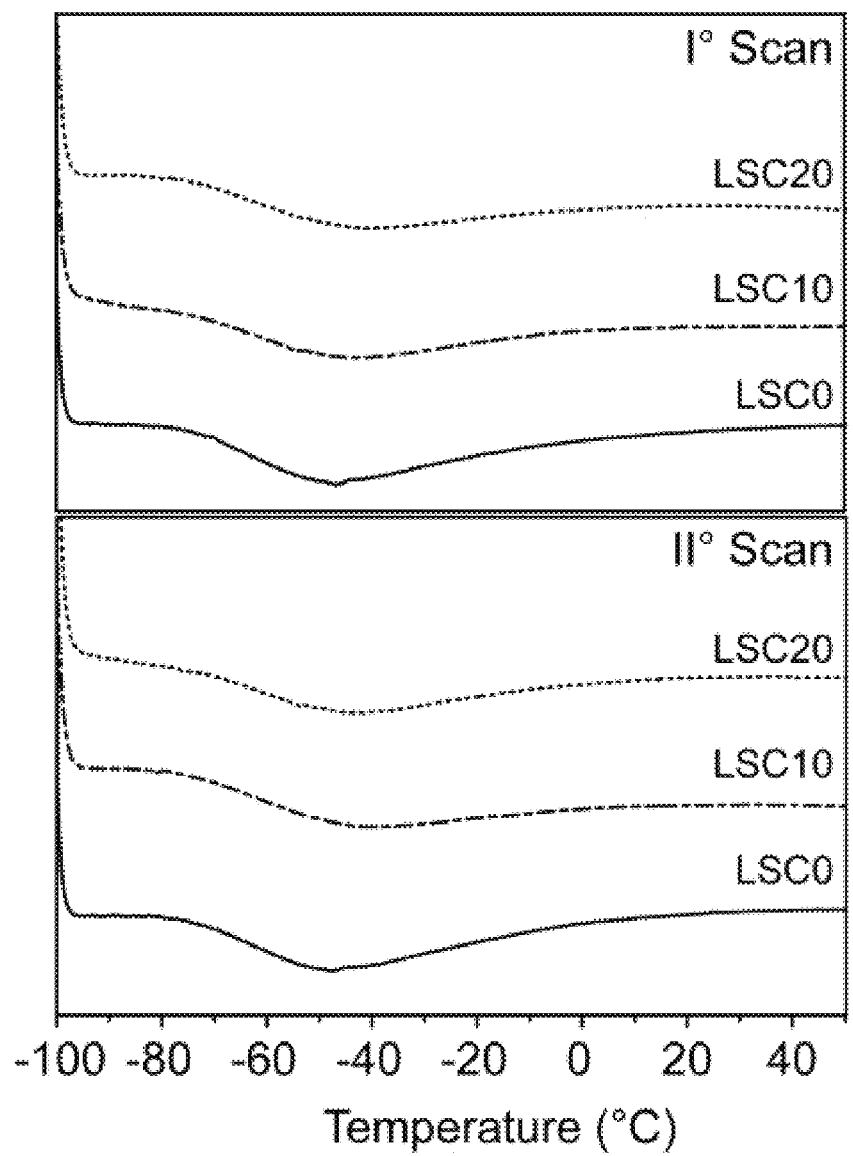
FIG. 5 is a plot of differential scanning calorimetry (DSC) curves of the pure polymer (LSC0) and CISeS QDs/P(LMA-co-EGDM) nanocomposites (LSC10 and LSC20).

FIG. 5 provides Differential Scanning calorimetry curves of the pure polymer (LSC0) and CISeS QDs/P(LMA-co-EGDM) nanocomposites (LSC10 and LSC20). First and second heating scans showed a transition glass temperature ($T_g$) of −65° C., in good agreement with literature. Moreover, the absence of exothermic phenomena (upwards peaks) during the first heating ramp indicated that the polymerization process had proceeded to completion.

Figure 6:
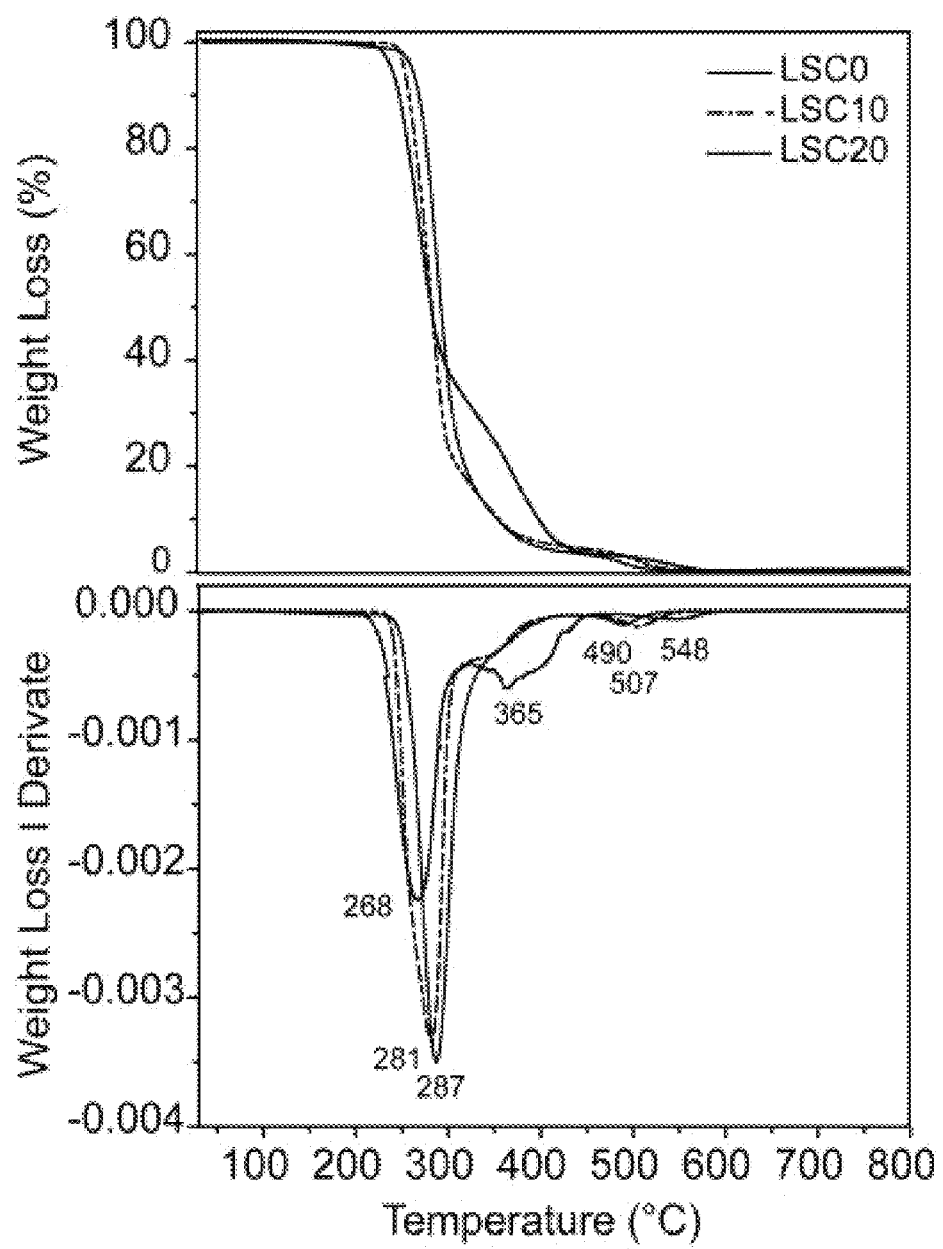
FIG. 6 provides plots of weight loss versus temperature, illustrating the TGA (Thermo-gravimetric) and DTA (differential thermo-gravimetric) curves of the pure polymer (LSC0) and CISeS QDs/P(LMA-co-EGDM) nanocomposites (LSC10 and LSC20).

During thermogravimetry (TGA) measurements carried out using a TA Q500 analyzer (TA Instruments) samples were heated to 800° C. at 10° C./minute in air. FIG. 6 provides TGA (Thermo-gravimetric) and DTA (differential thermo-gravimetric) curves of the pure polymer (LSC0) and CISeS QDs/P(LMA-co-EGDM) nanocomposites (LSC10 and LSC20). The weight of the residual corresponds to the amount of the QDs in the polymeric matrices: 0.3 wt % in LSC10 and 0.5 wt % in LSC20.

Spectroscopic Studies

All spectroscopic studies were carried out using toluene solutions of QDs loaded into quartz cuvettes and QD-PLMA nanocomposites. In the measurements of PL dynamics, the samples were vigorously stirred to avoid the effects of photocharging. Absorption spectra of QD solutions and QD-polymer composites were measured with a Perkin Elmer LAMBDA 950 UV/Vis/NIR spectrophotometer. PL, PLE and spectra and transient PL measurements were carried out using excitation with <70 ps pulses at 3.1 eV from a pulsed diode laser (Edinburgh Inst. EPL series). The emitted light was collected with a liquid-nitrogen-cooled low-noise Hamamatsu NIR (R5509-73) photomultiplier tube (PMT) coupled to time-correlated single-photon counting (TCSPC) electronics (time resolution about 150 ps). Optical measurements on LSCs were carried out by coupling the output edge of the slab to an integrating sphere and using a 532 nm cw laser as an excitation source. The PL was detected with the same PMT and the TCSPC unit describe earlier. The same setup was used for PL quantum yield measurements.

Transient absorption measurements were performed using a LabView-controlled home-build setup in a standard pump-probe configuration with 400-nm, approximately 100-fs pump pulses (1 kHz repetition rate) and a broad-band, white light supercontinuum probe. The excitation spot diameter was 800 µm at the $1/e^2$ level. The measurements were performed on QD solutions with optical density (OD) below 2 at 400 nm, which corresponded to QD concentrations of less than $1 \times 10^{-5}$ M. All the measurements were conducted under oxygen-free and moisture-free conditions using air-tight quartz cuvettes. The organic solvents used were dry and stored under argon. Sample preparation was done at inert atmosphere in a glovebox.

Monte Carlo Ray Tracing Simulation

The theoretical analysis of the efficiency of the LSC was performed via a Monte Carlo ray tracing method in which propagation of a photon within the LSC was modeled as propagation of a geometrical ray subject to refraction/reflection at the air-LSC interfaces according to Fresnel Laws. Accordingly, no interference was taken into account. The stochastic nature of the simulations was reflected in the fact that the ray was not split upon reaching an interface but rather either transmitted or reflected with the probabilities proportional to respective energy fluxes given by Fresnel Laws. The dependence of these probabilities on the state of polarization of the incident ray (e.g., s- or p-polarized) was also taken into account. A specific event (i.e., transmission or reflection) was chosen according to random Monte Carlo drawing.

Inside the LSC material, for each ray, the inverse transform sampling method was applied to randomly generate the length of the optical path before absorption by QDs. Path lengths follow the exponential attenuation law determined by the wavelength-dependent absorption cross-section, $\sigma(\lambda)$, and the QD concentration, $N_{QD}$, via an attenuation coefficient, $k(\lambda)=N_{QD}\sigma(\lambda)$. Since the mean path length, given by the inverse attenuation coefficient is always much greater than the average distance between QDs, there was no need to keep track of an explicit position of each QD, so the LSC material (PMMA+ QDs) was considered within the effective medium approach, i.e., as a uniform material with the attenuation coefficient defined above.

Once a photon was absorbed by a QD, the subsequent fate of the excitation (i.e., reemission or non-radiative relaxation) was again determined by the Monte Carlo sampling according to the PL quantum yield. The direction of reemission was distributed uniformly and the reemission wavelength was determined using the rejection sampling applied to the accurate QD PL spectrum obtained from experiment.

The ultimate fate of each photon was either loss due to non-radiative recombination or escape from the LSC via one of the interfaces. A single-ray Monte Carlo simulation was typically repeated $10^5$-$10^7$ times to have a proper statistical averaging.

Colorimetry Studies

CIE-L*a*b* color coordinates were extracted from the reflectance spectra measured with a Perkin Elmer Lambda 9000 spectrometer using to an integrating sphere and placing a Spectralon® scatterer on the back side of the LSCs, following the conventional procedure for colorimetric measurements on semitransparent materials. Both diffused and reflected light (8°) were collected. D65 illuminant spectrum was used for the calculation of the L*, a*, b* coordinates.

Color rendering index of the light transmitted by the LSCs was calculated following CIE13.3 procedure using eight Munsell test color samples (TCS). A D65 illuminant spectrum was employed both as a reference light source and as a light source filtered by the experimental absorption spectra of the LSCs.

Farnsworth-Munsell 100 hue color vision tests were performed on 40 non-color blind subjects between 20 and 55 years of age. In order to account for individual differences in color sensitivity across the whole statistic population, for each subject the test was performed in identical conditions both without any filter, and by filtering the subject's vision using the LSCs. The chronologic order of tests in the three conditions was chosen randomly across the population to avoid results to be biased by learning effects. The test was conducted on a calibrated monitor (Dell Vostro 3750).

Results and Discussion

CISeS QDs coated with ZnS were used to realize large-area IR QD-LSCs with reduced re-absorption losses and extended coverage of the solar spectrum. Specifically, CISeS QDs that had an emission at 960 nm (1.3 eV) were used, which was near optimal for LSCs coupled to Si PVs, and also allowed for the realization of colorless QD-doped slabs that are similar to neutral density filters and therefore well suited for applications as semitransparent windows. Overcoating CISeS QDs with a shell of a wide-gap ZnS allowed the spectral properties of emission to be preserved, as well as the emission efficiency upon exposure of the QDs to the radical polymerization initiators. By incorporating QDs into a photopolymerized, cross-linked polylauryl methacrylate (PLMA) matrix, freestanding, colorless polymer slabs of excellent optical quality were obtained that introduced no chromatic distortion. The lack of chromatic distortion was demonstrated by both color rendering index (CRI) measurements and a comparative Farnsworth-Munsell 100 hue discrimination test. Using this approach, and without the assistance of any back reflector, an optical power conversion efficiency $\eta=P_{OUT}/P_{IN}=3.2\%$ was achieved, where $P_{OUT}$ is the luminous power collected by the photodiodes coupled to the LSC perimetral edges, and $P_{IN}$ is the solar power incident onto the LSC surface. Finally, PL and transient absorption (TA) studies of the I-III-VI$_2$ QDs were conducted to elucidate the light emission mechanism and the nature of a large Stokes shift. These measurements suggested that light emission occurred via a transition involving a conduction band electron and a hole residing in a deep intra-gap state, which was likely associated with a "native" defect such as $Cu^{2+}$.

Figure 7:
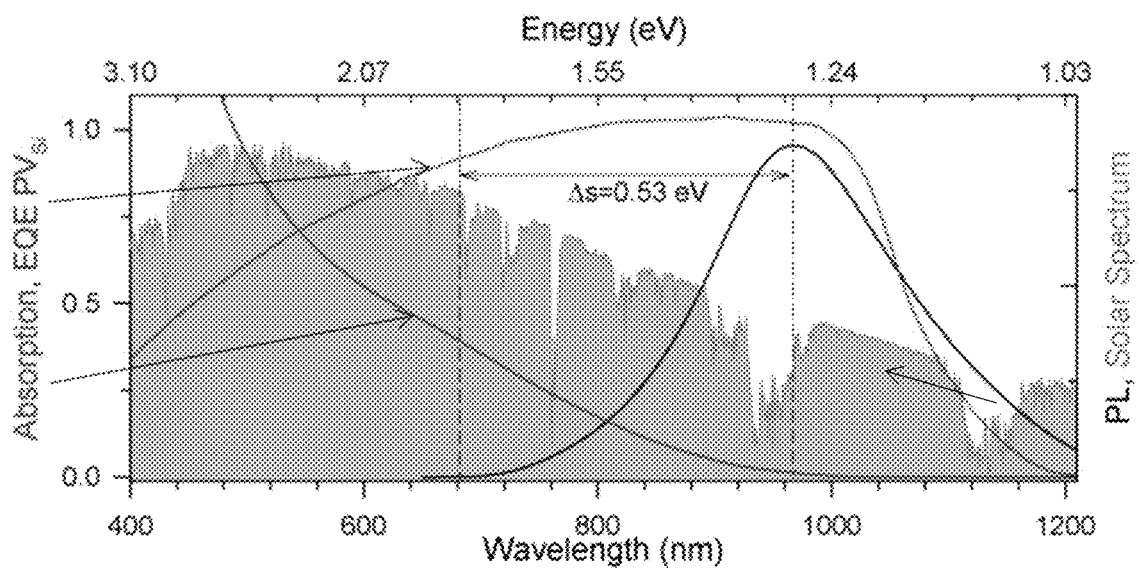
FIG. 7 is a plot illustrating the absorption, photoluminescence (PL), external quantum efficiency (EQE) and solar (grey shading) spectra versus wavelength.

FIG. 7 shows the optical absorption and PL spectra of representative ZnS-coated CISeS QDs dissolved in toluene (red and black lines, respectively) where they are compared to the terrestrial spectrum of solar radiation (grey shading) and a typical EQE spectrum of a Si PV (green line). The absorption spectrum showed almost a featureless profile characteristic of ternary QDs and extended over the entire range of visible wavelengths, which allowed for efficient capture of solar radiation. The PL spectrum closely matched the low-energy part of the EQE spectrum of a crystalline silicon PV cell, which corresponded to a near-optimal situation for converting re-emitted photons into electrical current. The reported EQE curve was the efficiency response of the 1 cm×2.5 cm c-Si PV cells used to build the concentrators (see below), which were not optimised for maximum power conversion efficiency. Using high performance PV cells with optimized design, or top-notch commercial modules, such as Sunpower X series, will allow for further extending the solar coverage and for boosting the efficiency of QD-LSCs without introducing extra fabrication costs.

The absorption spectrum exhibited a weak shoulder at approximately 640 nm (1.85 eV), which marked the position of the QD band edge. It was displaced from the PL band by 550 meV, which indicated a very large Stokes shift ($\Delta_s$), greatly exceeding that of standard "core-only" CdSe, PbS or PbSe QDs where it is typically a few tens of meV. An exceptionally large value of $\Delta_s$ is a general property of I—III-VI$_2$ QDs and is characteristic of both pure (CIS and CISe) and alloyed compositions.

To retain a high emission efficiency of the QDs during the encapsulation procedure, the emitting CISeS cores were protected with a shell of wide gap ZnS by adopting approach from McDaniel, H., Fuke, N., Pietryga, J. M. & Klimov, V. I., Engineered CuInSe$_x$S$_{2-x}$ Quantum Dots for Sensitized Solar Cells. *J. Chem. Phys. Lett.* 4, 355-361 (2013), which is incorporated herein by reference. As a matrix material, a cross-linked PLMA was used, which belongs to the family of acrylate polymers. Its long side-chains prevented agglomeration of the QDs and allowed for fabrication of high optical quality QD-polymer nanocomposites. Further, PLMA has a glass transition temperature of –65° C., and at room temperature represented a rubber-like material with long alkyl side chains that display dynamics resembling those of liquids. Since the polar methacrylate main chain and the nonpolar alkyl side chains are immiscible, the polymer bulk is phase separated at the nanoscopic level, which provided the QDs with local environment which was very similar to that of 1-octadecene or analogous solvents used in the QD synthesis. This specially designed near-native polymeric environment may help maintain long-term stability of the QDs.

The chemical structures of the organic precursors employed in the fabrication of the slabs are shown below.

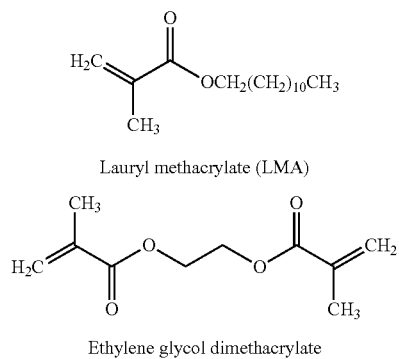

Lauryl methacrylate (LMA)

Ethylene glycol dimethacrylate

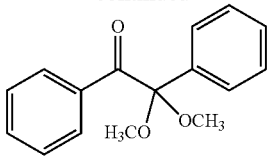

IRGACURE® 651

Figure 8:
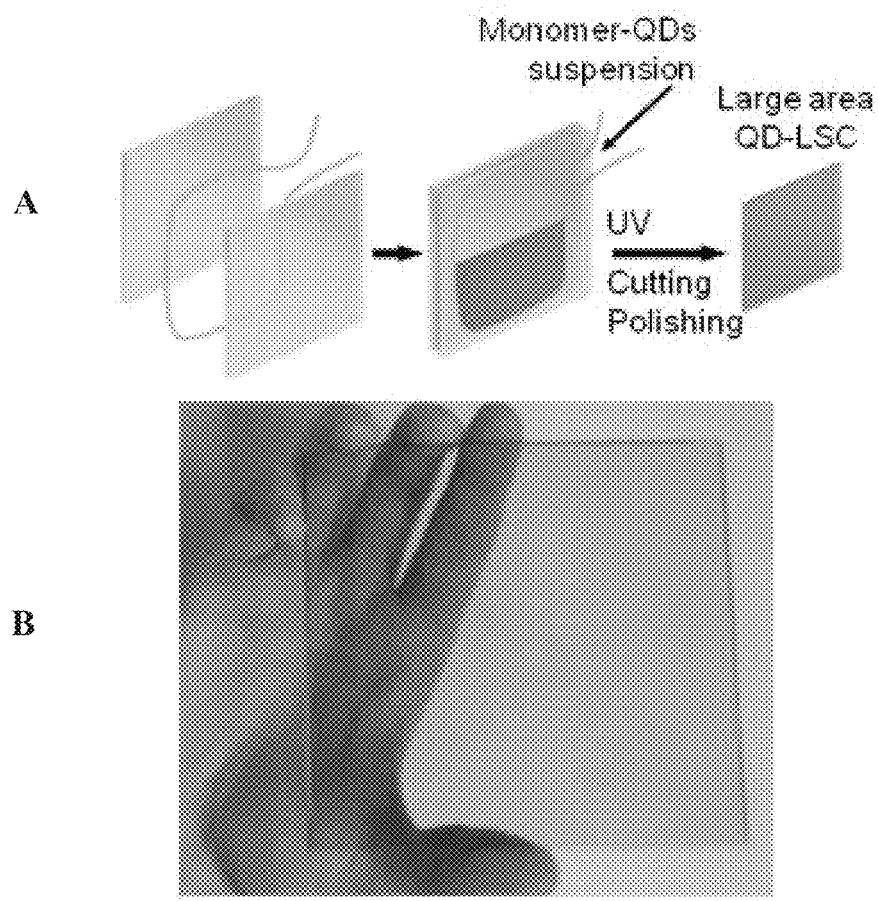
FIGS. 8A-8B provide a schematic representation of a cell casting procedure used for the fabrication of a quantum dot luminescent solar concentrator (QD-LSC) (FIG. 8A) and a photograph of an LSC comprising 0.3 wt % of the QDs under ambient illumination (FIG. 8B).

The fabrication procedure consisted of initially wetting the QDs in a small volume of lauryl methacrylate monomer for 3 hours to enable a fine dispersion of the individual particles to form. The monomer-QD mixture was then added to a large volume of monomer together with radical photoinitiator (IRGACURE 651; 1% w/w) and ethylene glycol dimethacrylate (EGDM; LMA:EGDM 80%:20% w/w) that acted as a cross-linking agent. It was important that the EGDM molecules, which bridge the main chains and help the mechanical stability of the slabs, were located in the hydrophobic domains of the nanocomposite and thus were spatially separated from the QDs and therefore unlikely to alter their electronic properties. After stirring the mixture for 20 minutes and sonication for 10 minutes, the LSCs were fabricated following a cell-casting procedure typically used for the preparation of optical grade polymer slabs (FIG. 8A). Briefly, the homogeneous mixture was poured into a mold of low roughness tempered glass and irradiated with 365 nm light for 5 minutes in order to trigger radical polymerization. The polymerization was then completed by keeping samples in dark for 30 minutes while leaving them in the mold in order to avoid creation of cracks. After the completion of the procedure, the slabs were removed from the mold, cut in pieces of desired sizes, and polished. A high optical quality of the fabricated composites is illustrated by a photograph in FIG. 8B which shows an LSC based on CISeS QDs and P(LMA-co-EGDM) with dimensions of 12 cm×12 cm×0.3 cm.

Figure 9:
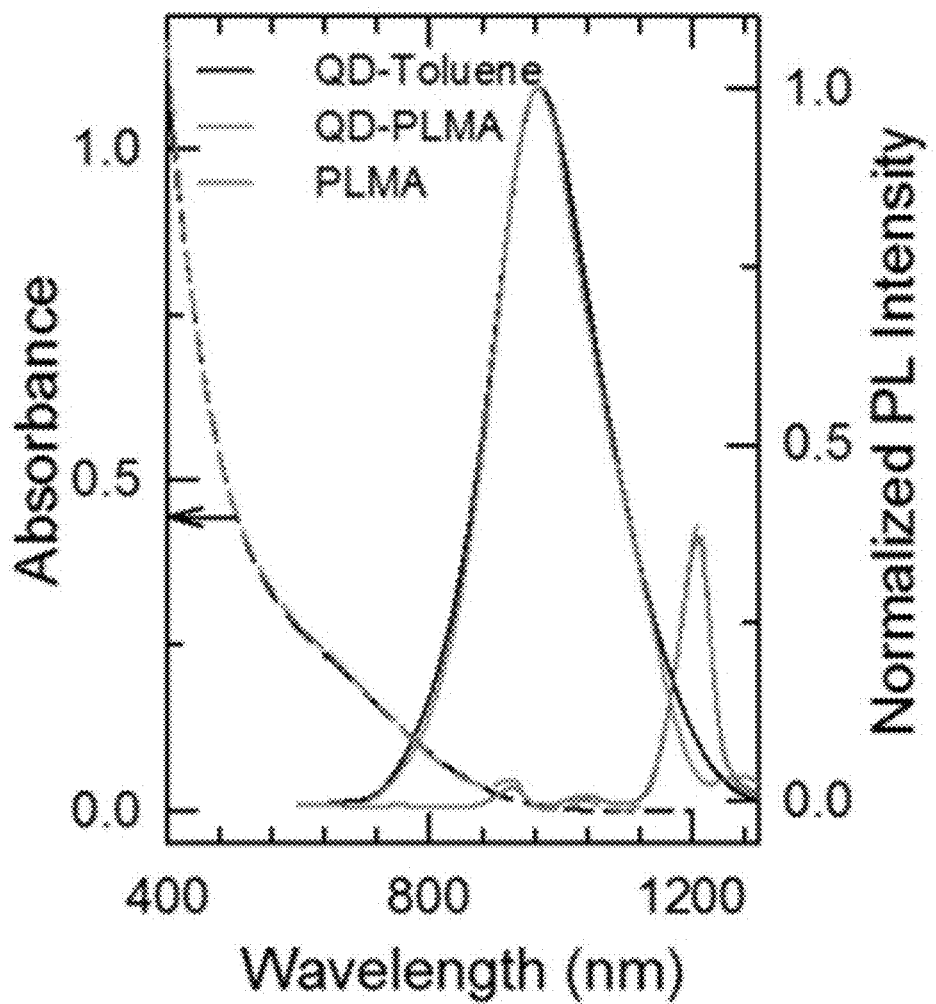
FIG. 9 is a plot of absorbance (dashed lines) and photoluminescence (solid lines) versus wavelength, illustrating the absorbance and photoluminescence of the QDs in toluene (black) and in a polymer (PLMA) matrix (red).
Figure 10:
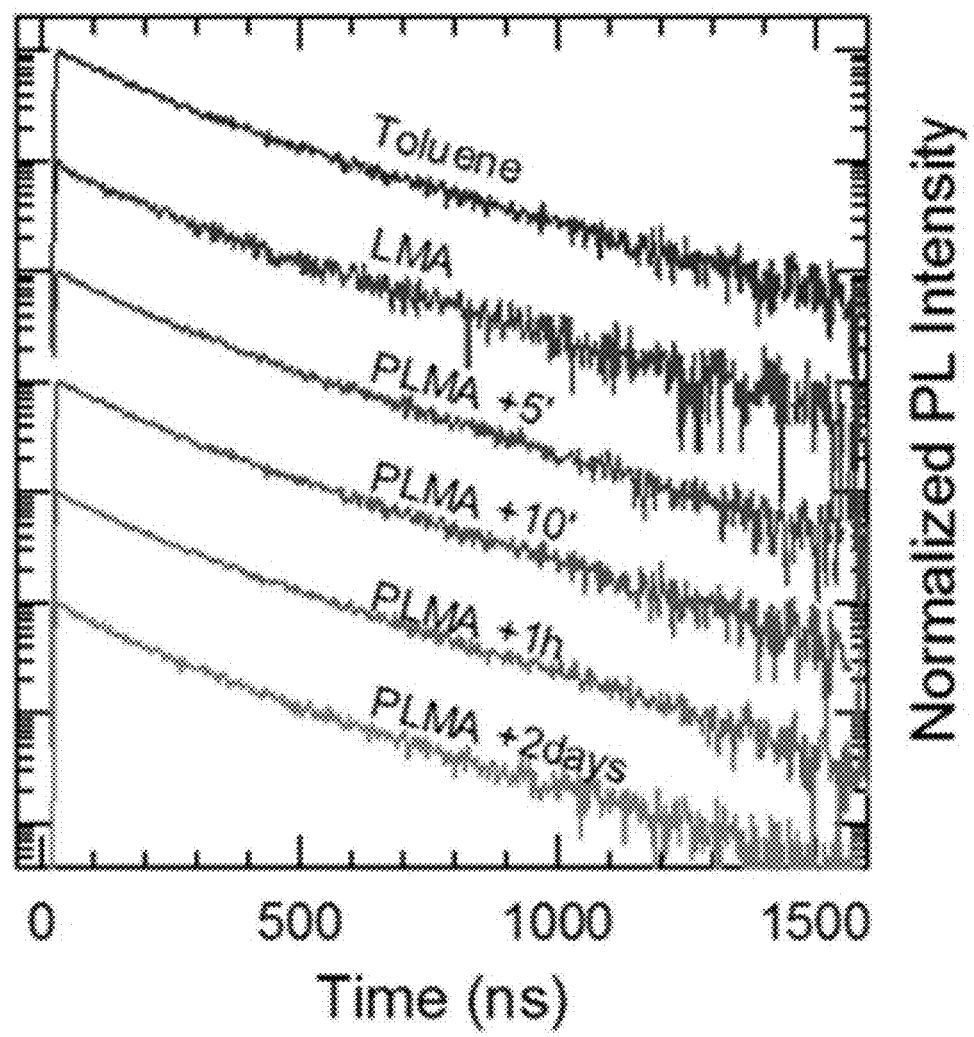
FIG. 10 is a plot of photoluminescence versus time, illustrating the photoluminescence decays measured using weak pulsed 405 nm excitation of ZnS-coated CISeS QDs in different environments.
Figure 11:
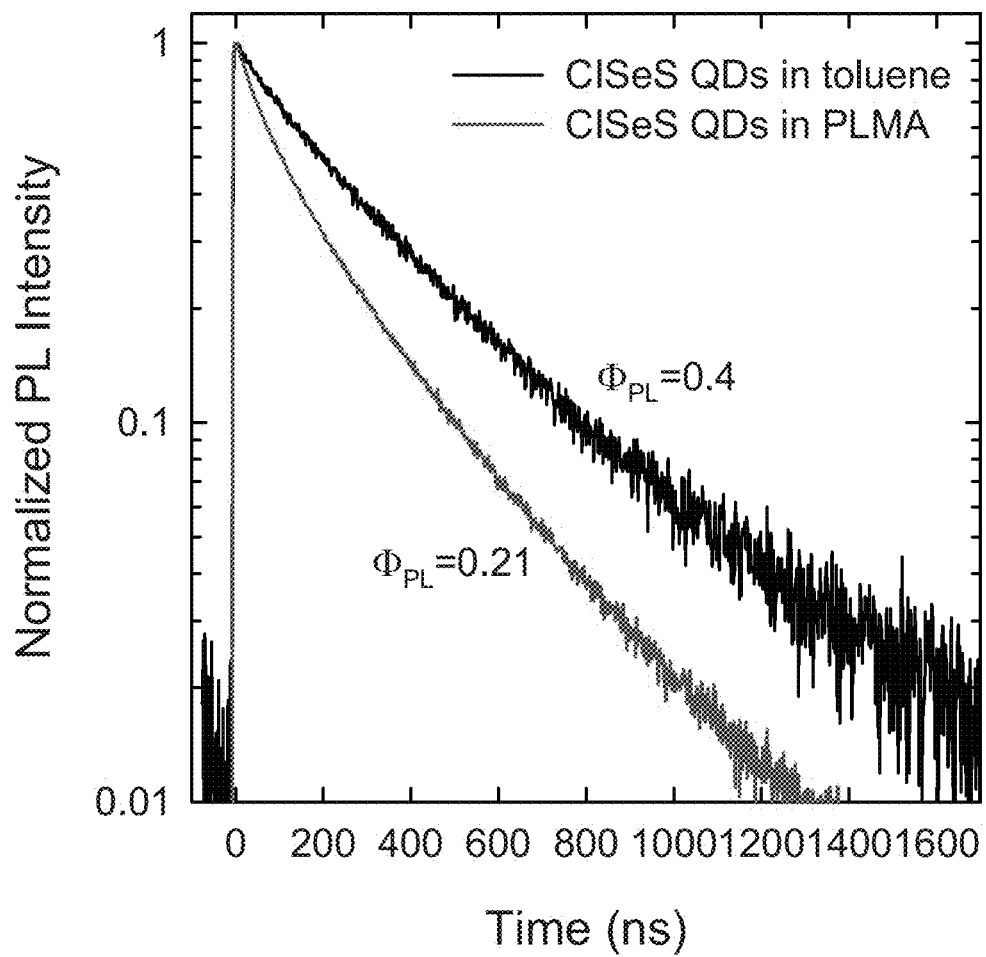
FIG. 11 is a plot of photoluminescence versus time, illustrating the room temperature photoluminescence decay of CISeS QDs with no further ZnS passivation in toluene (black) and PLMA (red).

Spectroscopic studies of the fabricated composites demonstrated that the spectral and dynamical properties of ZnS-coated CISeS QDs were unaffected by the radical polymerization procedure. Specifically, both the absorption and PL spectra of the QDs in the polymer matrix were essentially identical to those of the QDs in toluene solution (FIG. 9) and so is the PL quantum yield ($\Phi_{PL}$=40±4%) measured using an integrating sphere under continuous wave (cw) excitation at 473 nm. FIG. 9 also provides the absorption spectrum of the P(LMA-co-EGDM) matrix. The absence of additional nonradiative decay channels in the nanocomposites was confirmed by the analysis of the PL dynamics (FIG. 10). In FIG. 10, the top trace is from ZnS-coated CISeS QDs in toluene; the second trace from the top is from QDs in lauryl methacrylate; and traces three through six from the top are QDs in an LMA-co-EGDM matrix, with different traces corresponding to different times after completion of the polymerization. FIG. 10 illustrates that the PL decay measured for the ZnS-coated QDs in toluene was essentially identical to that of the QDs in the LMA:EGDM:IRGACURE® mixture both before and after activation of the radical photocatalyst. In contrast, uncoated CISeS QDs underwent about 50% PL quenching upon activation of the radical catalyst (FIG. 11). This highlights the important role played by a wide-gap ZnS passivation in preserving light-emitting properties of the QDs core in the case of various chemical treatments.

Figure 12:
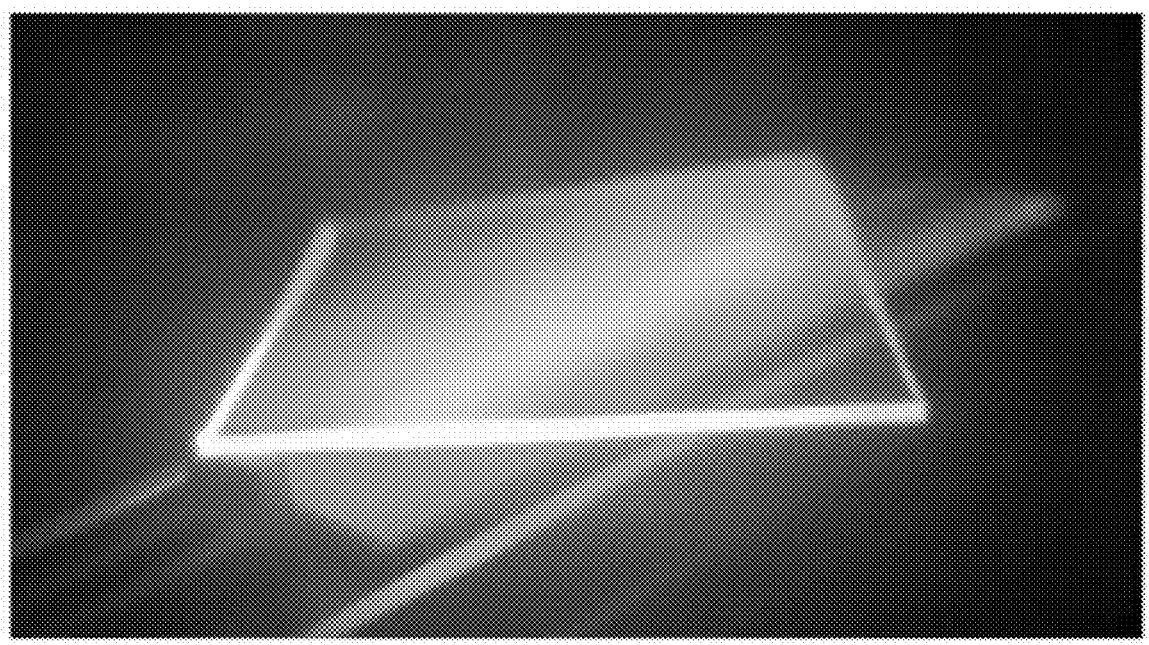
FIG. 12 is a photograph taken with a UV-filtered IR camera of a disclosed luminescent solar concentrator comprising 0.3 wt % of ZnS-coated CISeS QDs under UV illumination.

After characterizing light emitting properties of the fabricated nanocomposites, the optical losses due to re-absorption were analyzed. To illustrate how the QD PL excited across the waveguide was guided towards the slab edges, FIG. 12 shows a photograph of an exemplary devices under UV illumination taken with an UV-filtered IR camera.

Figure 13:
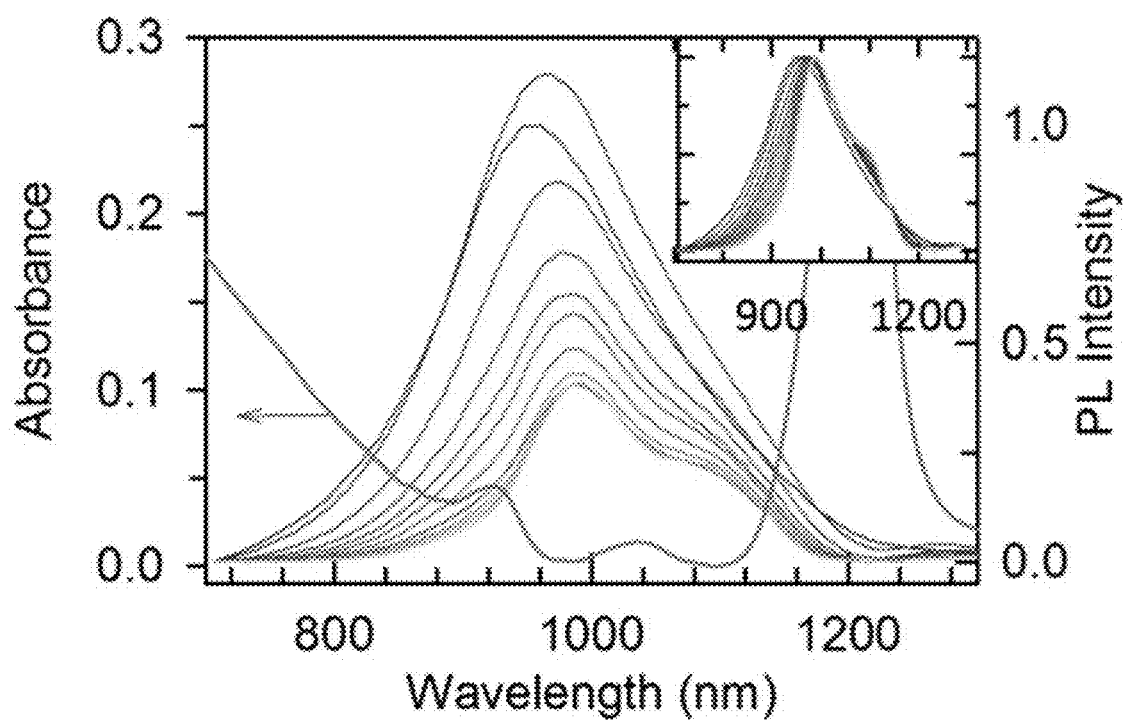
FIG. 13 is a plot of absorbance and photoluminescence versus wavelength, illustrating the photoluminescence collected at the edge of the LSC when the excitation spot was located at various distances from the edge.
Figure 14:
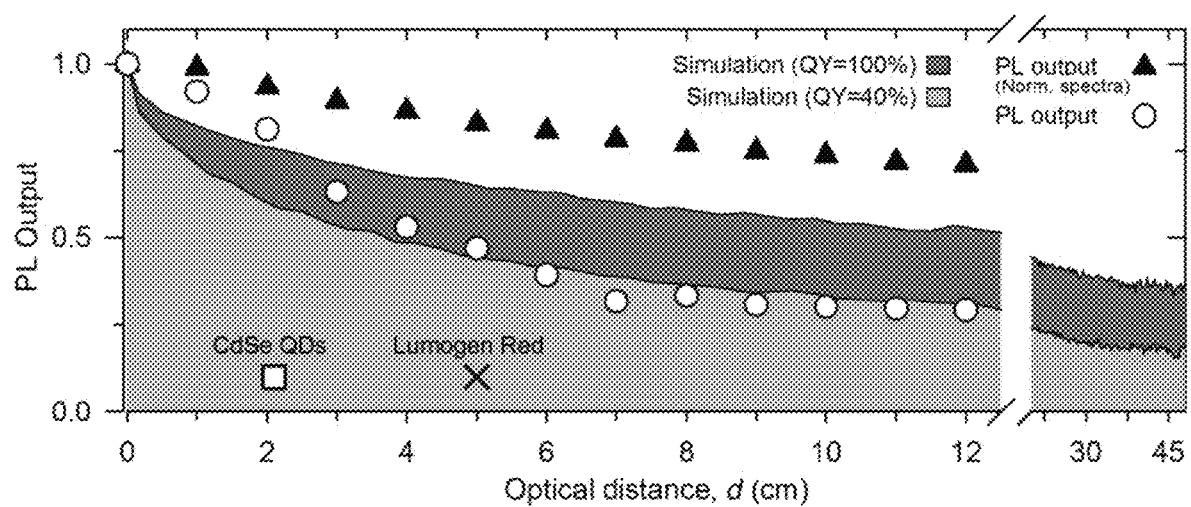
FIG. 14 is a plot of photoluminescence versus optical distance, illustrating the photoluminescence output as a function of distance.

FIG. 13 shows the absorption spectrum of the QD-polymer slab measured for light incident at a normal angle onto its largest side. FIG. 13 also displays spectra of photoluminescence collected at one of the slab edges (12 cm×0.3 cm) with an integrating sphere using cw 532 nm excitation, with the pump spot positioned at different distances (d from 0 cm to 12 cm) from the sample edge. The photoluminescence intensity dropped with increasing d (see also FIG. 14) due to a combined effect of light escape from the waveguide and re-absorption by the QDs. The shape of the normalized PL spectra showed only a small change with d (FIG. 13, inset) suggesting that losses to re-absorption are not significant. Non-normalized PL spectra (main panel) indicated that the overall PL intensity dropped with increasing d due to scattering at optical imperfections within the P(LMA-co-EGDM) matrix and photon escape from the waveguide. FIG. 14 shows the photoluminescence output as a function of d (white circles; derived by integrating the spectra in the main panel of FIG. 13) in comparison to the probability of photon reaching the LSC edge computed using Monte Carlo ray tracing (shaded in pink for $\Phi_{PL}$=40%; and in green for $\Phi_{PL}$=100%). PL output obtained by integrating the normalized PL spectra in the inset of FIG. 13 is reported as black triangles.

Figure 15:
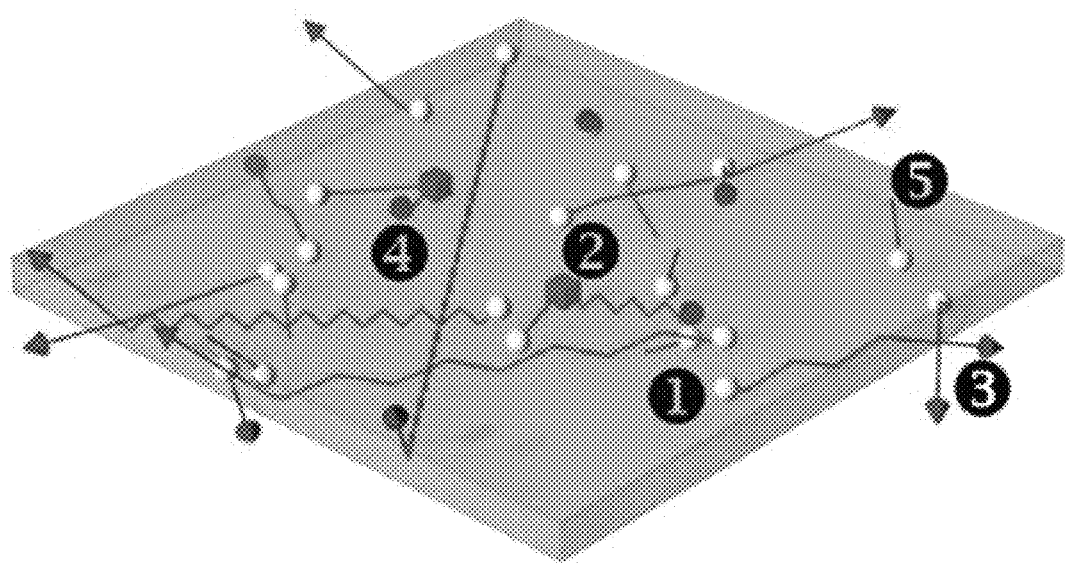
FIG. 15 provides examples of photon trajectories obtained from Monte Carlo ray tracing simulations.
Figure 16:
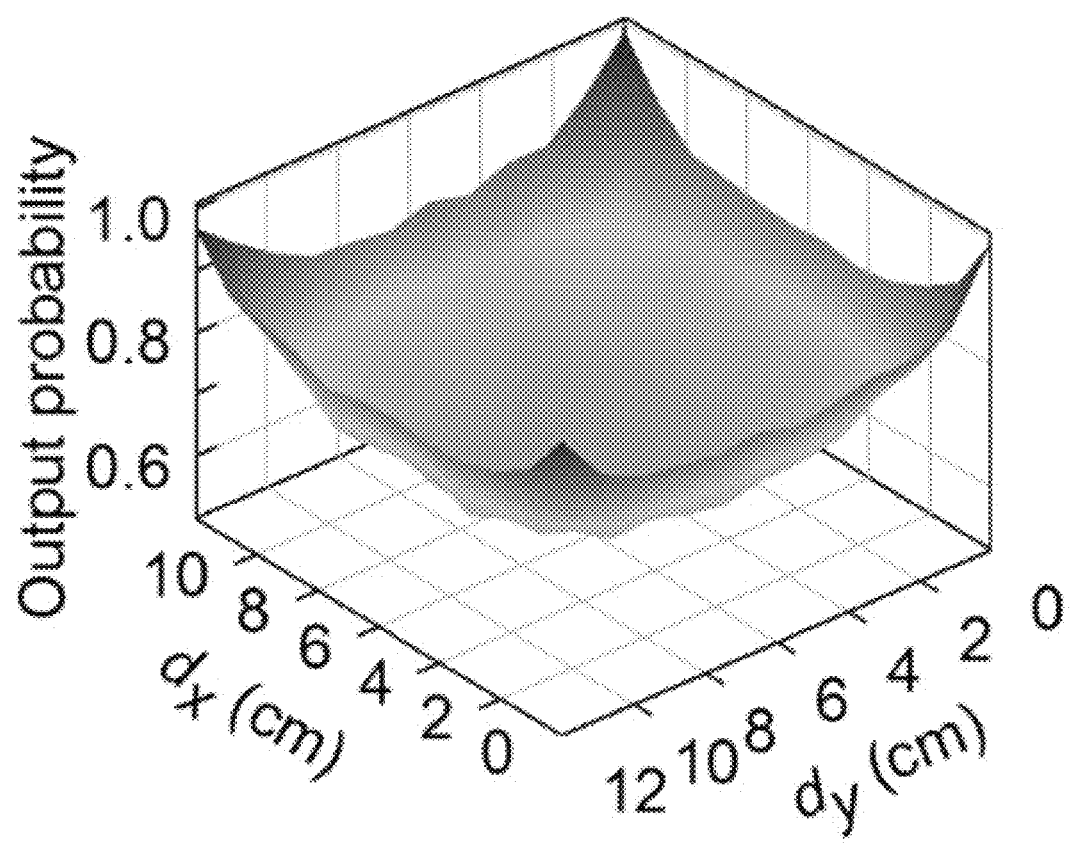
FIG. 16 is a schematic representation of the relative probabilities for re-emitted photons to reach an LSC edge.
Figure 17A:
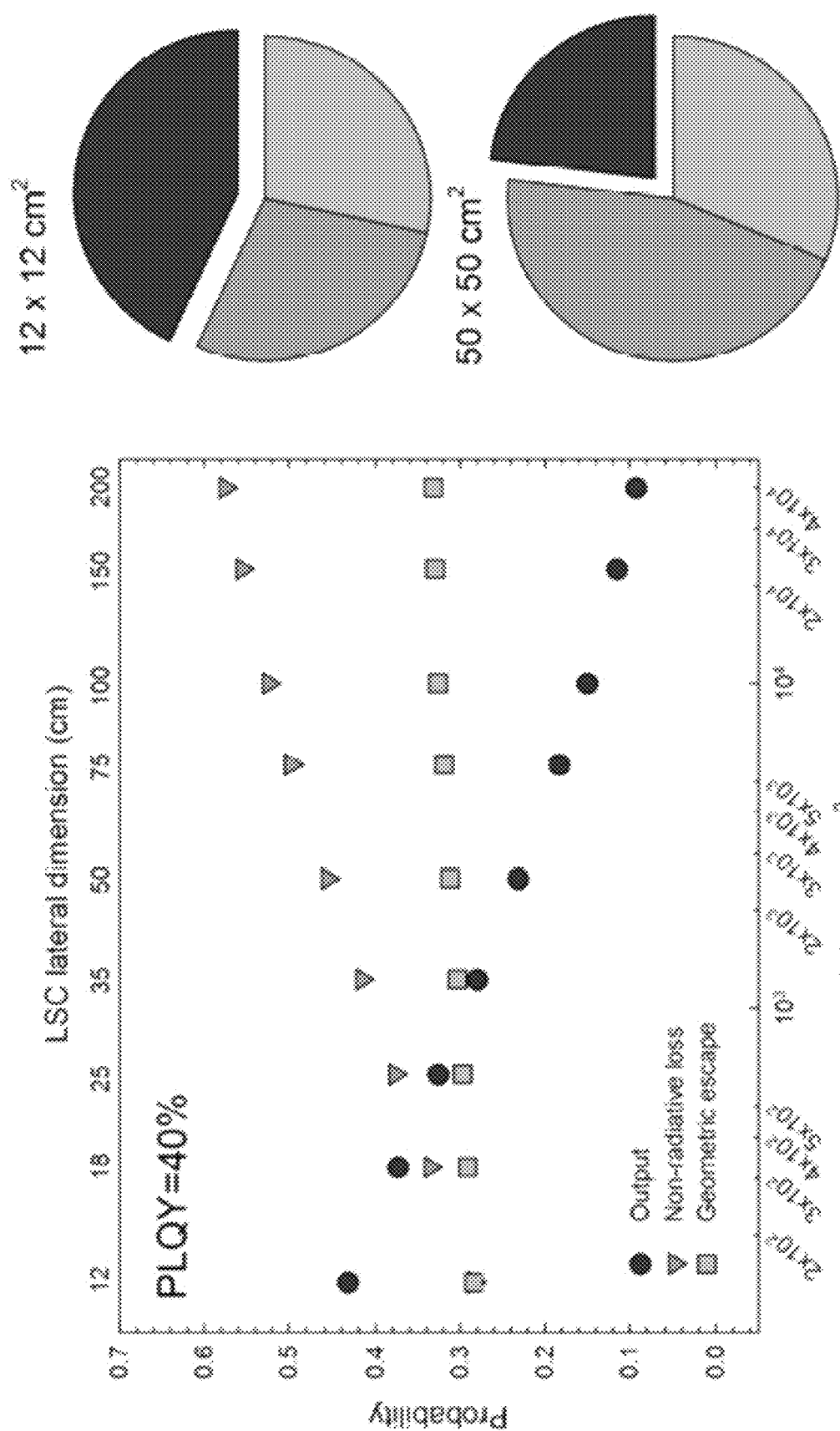
FIG. 17A provides Monte Carlo ray tracing simulations of photon output probability in comparison to the probability of non-radiative decay and photon escape through the device surfaces for the LSCs from FIGS. 12-16, considering QDs with photoluminescence quantum yields of 40%.
Figure 17B:
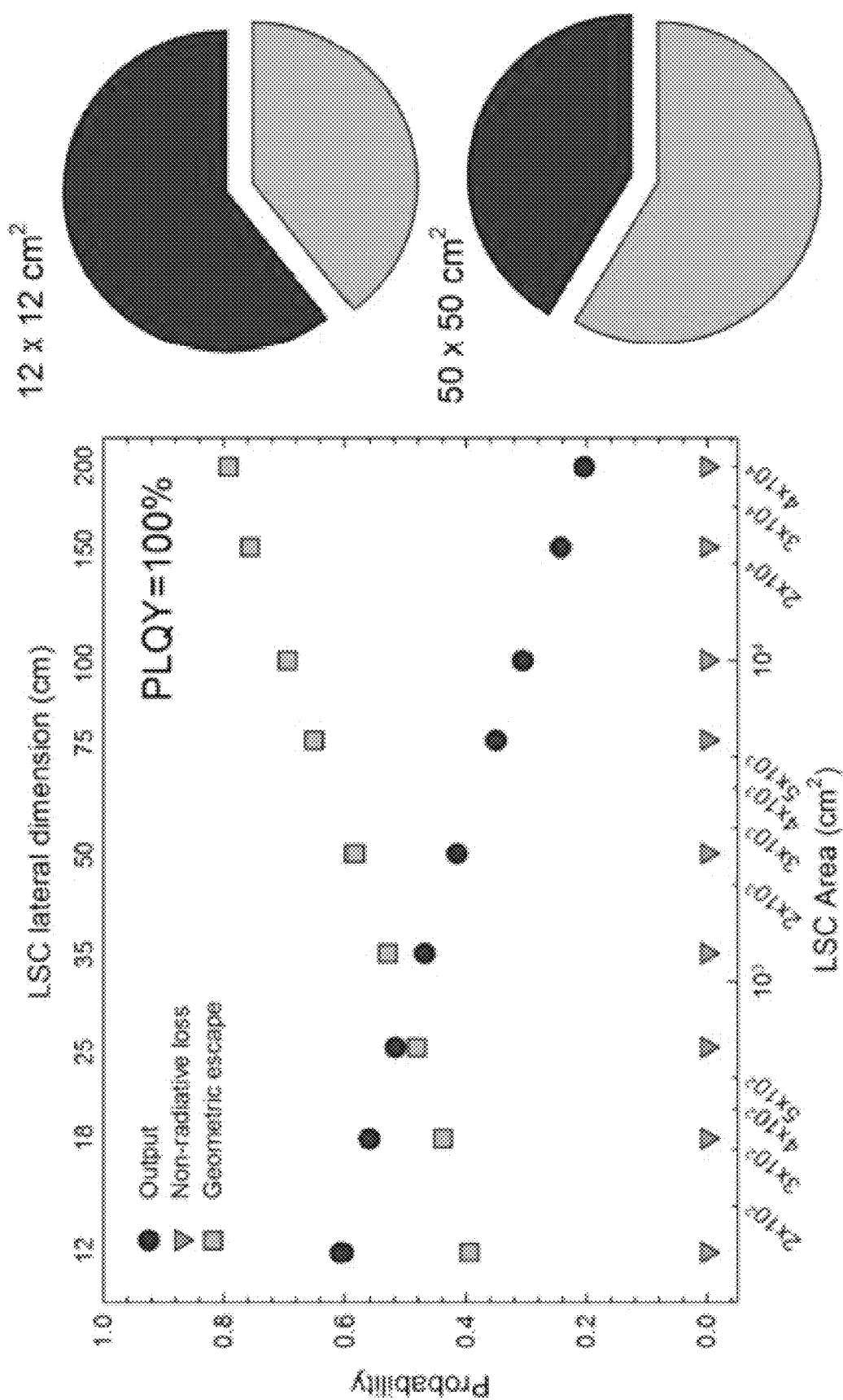
FIG. 17B provides Monte Carlo ray tracing simulations of photon output probability in comparison to the probability of non-radiative decay and photon escape through the device surfaces for the LSCs from FIGS. 12-16, considering QDs with photoluminescence quantum yields of 100%.

In order to distinguish between different mechanisms for optical losses Monte Carlo ray tracing simulations were performed using experimental parameters of LSCs fabricated in this work (FIGS. 15 and 16) and neglecting scattering at optical imperfections within the slab or at its surfaces. Possible trajectories of photons generated inside the slab (generation points are indicated by white dots) are depicted in FIG. 15. The initial emission of a photon within the LSC, depicted by white spheres (1), is followed by a photon propagation within the slab subject to absorption/reemission events (2), shown by purple cubes. The following ultimate fates of a photon within the LSC are considered: (3) the photon reaches the LSC edge and is harvested by the PV cell (red arrows); (4) the photon is lost via absorption by a QD followed by a nonradiative decay (black balls); and (5) the photon is lost by escaping through one of the LSC faces not coupled to a PV (red lines sticking outside the LSC). The probabilities of these three scenarios was evaluated as a function of the lateral position of the point of origin of the emitted photon within the slab considering uniform illumination of the LSC from the top (FIG. 16). In these calculations, experimental absorption and emission profiles of the QDs embedded into the polymer waveguide were used (FIG. 9) and $\Phi_{PL}$ was assumed to be 40%. By averaging over $10^5$-$10^7$ different emission events randomly generated across the device, the total output probability per originally emitted, first-generation photon was estimated to be 44%, while the probabilities of a photon loss due to nonradiative decay following one or more re-absorption events or escape from the waveguide were respectively 27% and 29%. To highlight the potential of the disclosed LSCs for the realization of large-area devices applicable as PV windows, calculations of the output probability as a function of LSC area for devices up to 2 m×2 m were performed, in comparison to losses due to photon escape from the waveguide and reabsorption followed by non-radiative decay (FIGS. 17A and 17B). The simulation indicated that for $\Phi_{PL}$=40%, the output probability dropped to about 50% for a 50 cm propagation length, whilst for QDs with $\Phi_{PL}$=100% the propagation length required for the 50% optical loss increased up to 1 meter. The calculations were performed using the experimental absorption spectrum of the final polymer slab doped with QDs and therefore the emission losses account also for absorption by the polymer matrix.

To evaluate the role of losses due to scattering at optical imperfections within the fabricated polymer-QD slabs, results of experiments where PL was excited at different distances from the LSC edge were modeled (FIG. 13). The simulated evolution of the PL intensity with d assuming the PL quantum yield of 40% is shown in FIG. 14 (pink shading) and correlated well with the experimental data. A fairly close correspondence between the modeling and the experimental data (white circles) suggested that scattering losses, disregarded by the model were indeed negligibly small in the disclosed devices, which again attests to the high optical quality of the QD-polymer nanocomposites.

To estimate the ultimate optical power conversion efficiency achievable with these LSCs, the situation where the QD PL yield reached the ideal value of 100% (green area in FIG. 14) was modeled. In this case, the probability to harvest a photon at the LSC edge increased to 61% while the remaining 39% accounted for optical losses due to photon escape from the waveguide.

Further, to distinguish losses due to re-absorption from those due to photon escape, the normalized PL spectra shown in the inset of FIG. 13 was analyzed. Specifically, the plot was spectrally integrated and the results plotted as a function d (FIG. 14, black triangles). In this case, the change in the PL signal can only occur as a result of spectral distortion caused by light re-absorption by the QDs. Therefore, these data were used to quantify emission losses due exclusively to re-absorption. Based on the plot in FIG. 14, the loss was estimated to be about 30% on a distance of 12 cm. This value was considerably smaller than attenuation observed, e.g., for standard, heavy metal-containing CdSe or PbS QDs, which may be a consequence of the large Stokes shift characteristic of CISeS QDs. For comparison, standard PbS QDs with a Stokes shift of about 120 nm show more than 70% losses to re-absorption on the length of less than 8 cm.

Figure 18:
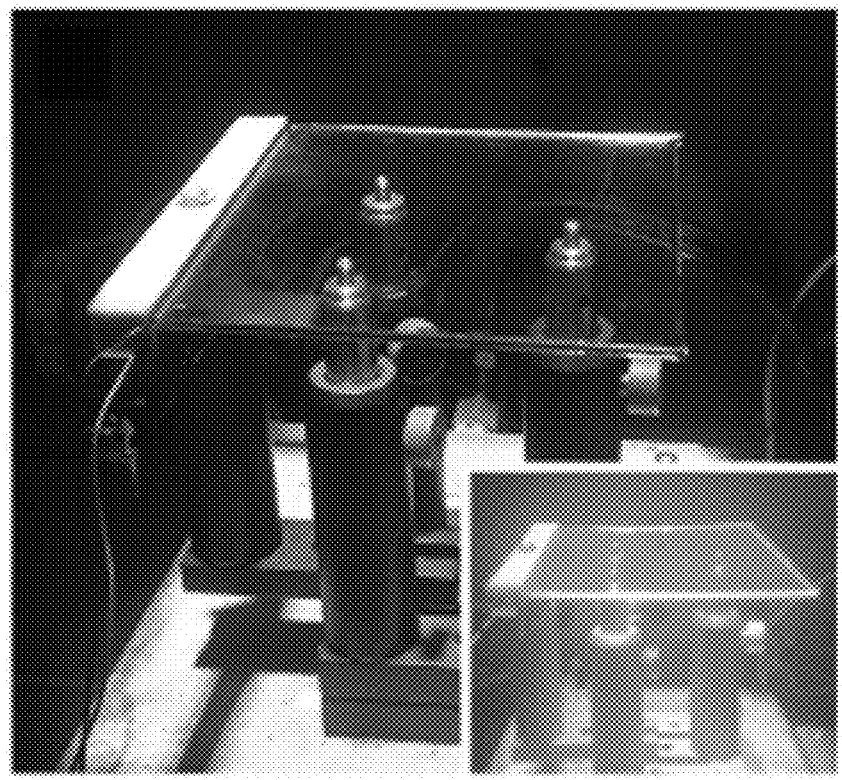
FIG. 18 is a photograph of a ZnS-coated CISeS QD LSC during optical power conversion efficiency measurements with illumination from a solar simulator (1.5 AM Global), and an inset showing the photograph of the same device taken with an IR camera.
Figure 19:
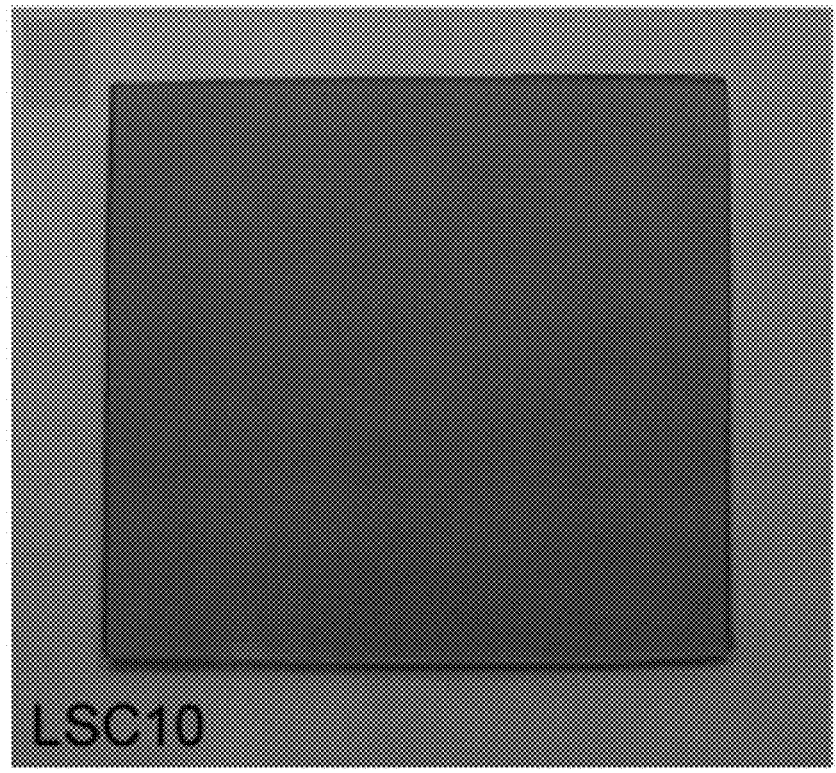
FIG. 19 is a photograph of a large area LSC with dimensions 12 cm×12 cm×0.3 cm comprising 0.3 wt % QDs that absorbs approximately 10% of spectrally integrated incident radiation (LSC10).
Figure 20:
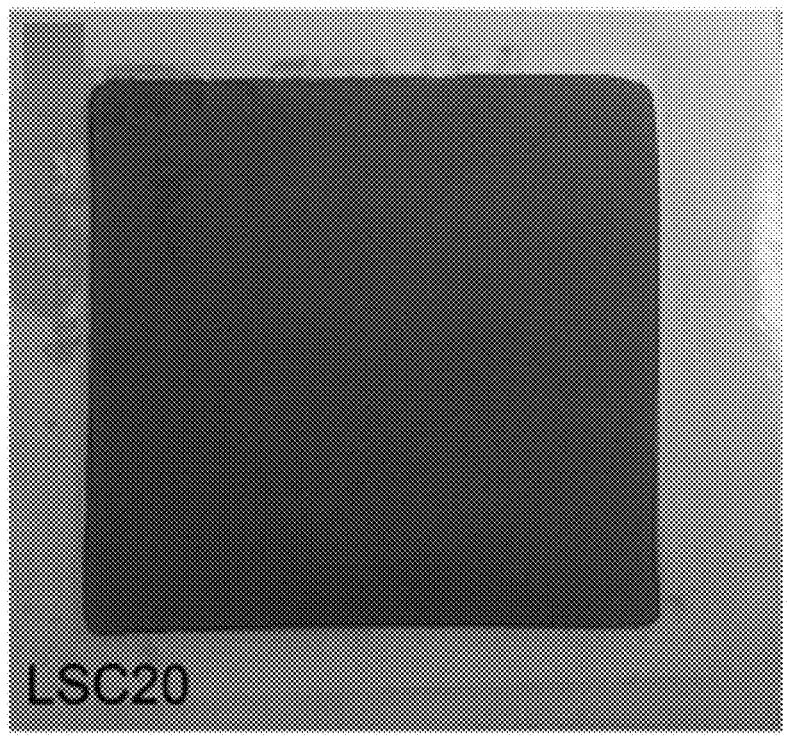
FIG. 20 is a photograph of a large area LSC with dimensions 12 cm×12 cm×0.3 cm comprising 0.5 wt % QDs that absorbs approximately 20% of spectrally integrated incident radiation (LSC20).

To quantify the efficiency of the fabricated LSCs, a characterization setup shown in FIG. 18 was used, to study two samples that absorb 10% (LSC10, 0.1 wt % QDs, FIG. 19) and 20% (LSC20, 0.2 wt % QDs, FIG. 20) of the incident solar power. The concentrators were illuminated perpendicular to their surface (area $A_{LSC}$=12 cm×12 cm=144 cm$^2$) by a calibrated solar simulator with power density I=100 mW/cm$^2$ (1.5 AM Global). The light radiated from the edges of the waveguide was collected using calibrated silicon photodiodes installed along the slab perimeter (area $A_{edge}$=48 cm×0.3 cm=14.4 cm$^2$). In order to reproduce the situation of a PV window exposed to sunlight, no reflector was placed at the bottom of the slabs. The optical power conversion efficiency was calculated using the expression: $\eta = P_{OUT}/P_{IN}$, where $P_{OUT}$ is the luminous power collected by the photodiodes and $P_{IN}$ is the solar power incident onto the LSC surface. Based on these measurements, a value of $\eta$=1.02% was obtained for LSC10 and $\eta$=3.27% for LSC20. These results were particularly remarkable considering that both samples exhibited a high degree of transparency across the visible spectrum.

Figure 21:
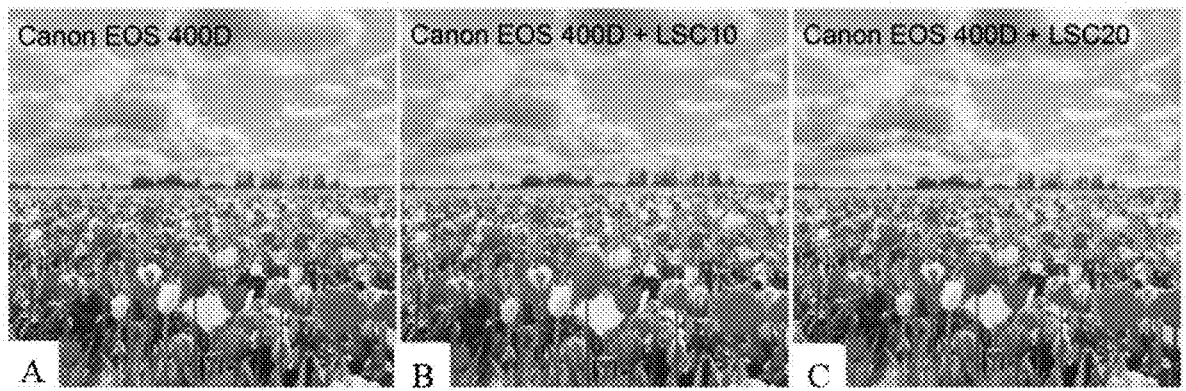
FIGS. 21A-21C provide three photographs of a colorful scene taken with a Canon EOS 400D camera without using any filters (FIG. 21A), or with an LSC10 (FIG. 21B) or an LSC20 (FIG. 21C) placed in front of the camera lens.
Figure 22:
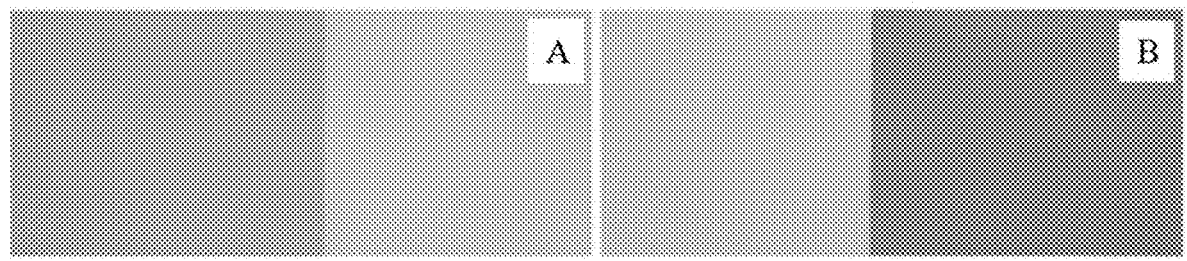
FIGS. 22A-22B provides two photographs of a reflecting white background taken with the same camera and half of the field of view filtered with LSC10 (FIG. 22A) and LSC20 (FIG. 22B).

Another property of these LSCs, which benefits their application as building integrated PVs, is that they do not introduce a significant distortion to the spectrum of solar radiation, that is, behave as uncolored, neutral density filters. This property was qualitatively illustrated by taking photographs of a color-rich scene (tulip field) either without any filtering (FIG. 21A) or with LSC10 (FIG. 21B) or LSC20 (FIG. 21C) placed in front of the camera lens. It can be clearly seen that neither of the LSC samples introduced any apparent color distortions; a small effect of a denser LSC20 sample was a slight accentuation of warm color tones. These pictures were taken exclusively to highlight the color filtering effect of the LSCs and not their absolute attenuation factor. FIGS. 22A and 22B provide an estimation of the light attenuation effect of the devices. FIGS. 22A and 22B are photographs taken with fixed exposure time and aperture of a white scattering background, and with filtering half of the field of view with LSC10 (FIG. 22A) and LSC20 (FIG. 22B).

Figure 23:
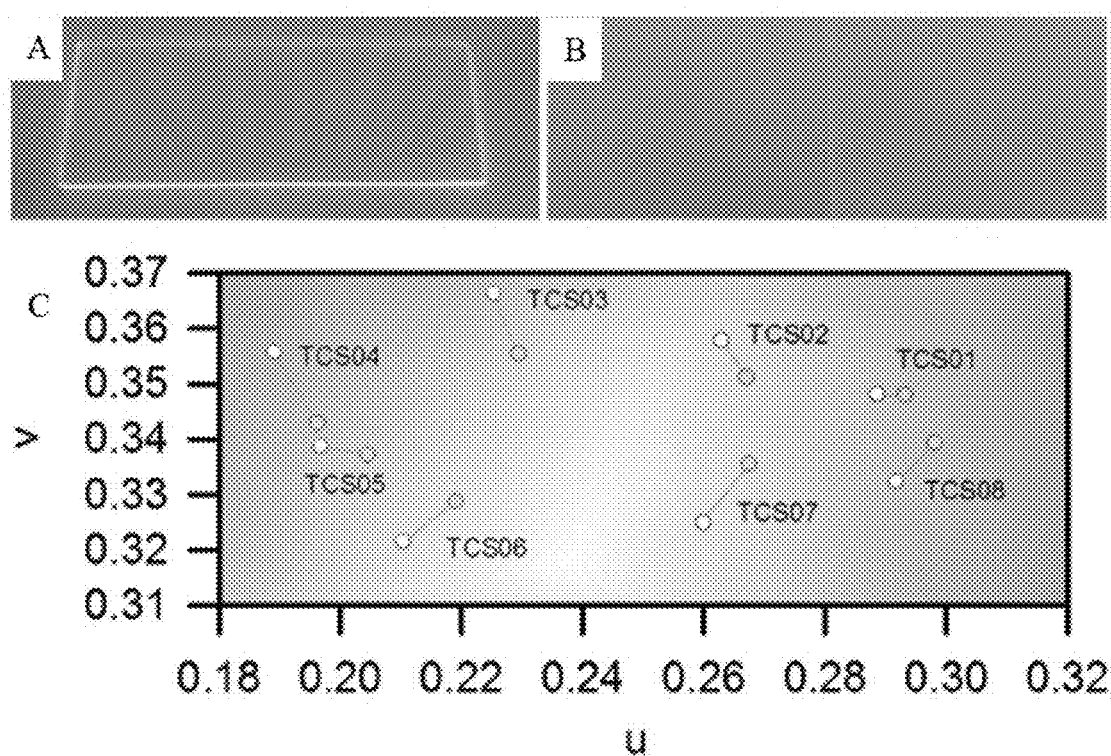
FIG. 23A is a photograph of an LSC (12 cm×3.5 cm×0.3 cm) incorporating Crs040 Yellow dye.
FIG. 23B is a photograph of a reflecting white background taken with the same camera as used in FIG. 23A with half of the field of view filtered with the Crs040-LSC.
FIG. 23C is a color rendering index (CRI) plot of original Munsell test color samples (TCS) under D65 reference illuminant before (white circles) and after chromatic adaptation by the Crs040-LSC (yellow circles).

In order to quantify both the color appearance of our devices and their effects on color perception, and to further emphasize the difference with respect to traditional colored LSCs, side-by-side colorimetry evaluations were performed on LSC20 and on an LSC based on Crs040 Yellow, a typical large Stokes-shift organic emitter, fabricated so as to exhibit the same total absorbance across the whole solar spectrum (about 20%). FIG. 23A provides a photograph of the LSC based on Crs040 Yellow. FIG. 23B is a photograph of a reflecting white background taken with the same camera filtering half of the field of view with the Crs040-LSC. FIG. 23C is a color rendering index (CRI) plot of original Munsell test color samples (TCS) under D65 reference illuminant before (white dots) and after chromatic adaptation by the same LSC, illustrating that the total color rendering index $R_a$ is 56.6.

Figure 24:
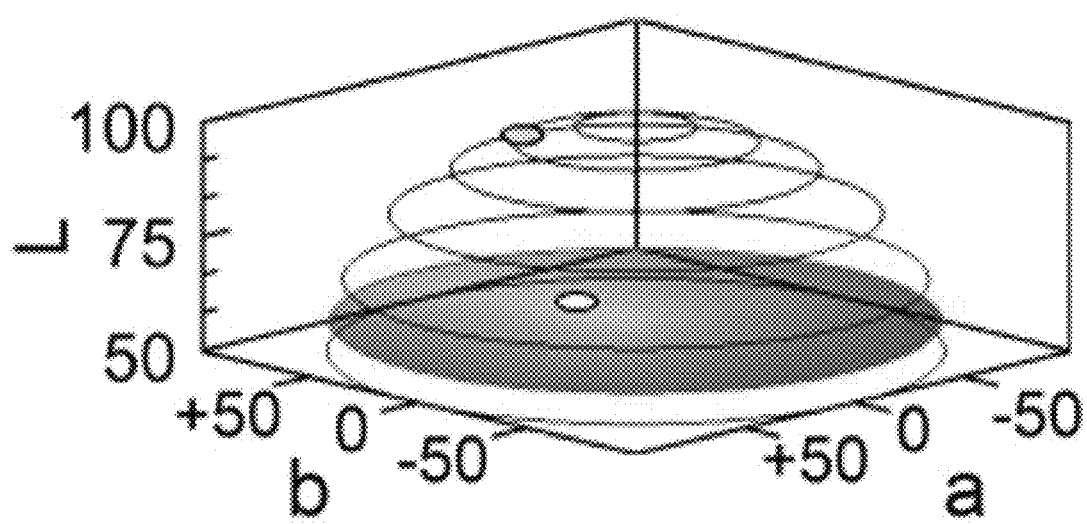
FIG. 24 is a CIE L*a*b* (Commission Internationale de le Éclairage) representation of the color space of the LSC20 and Crs040-LSC.
Figure 25:
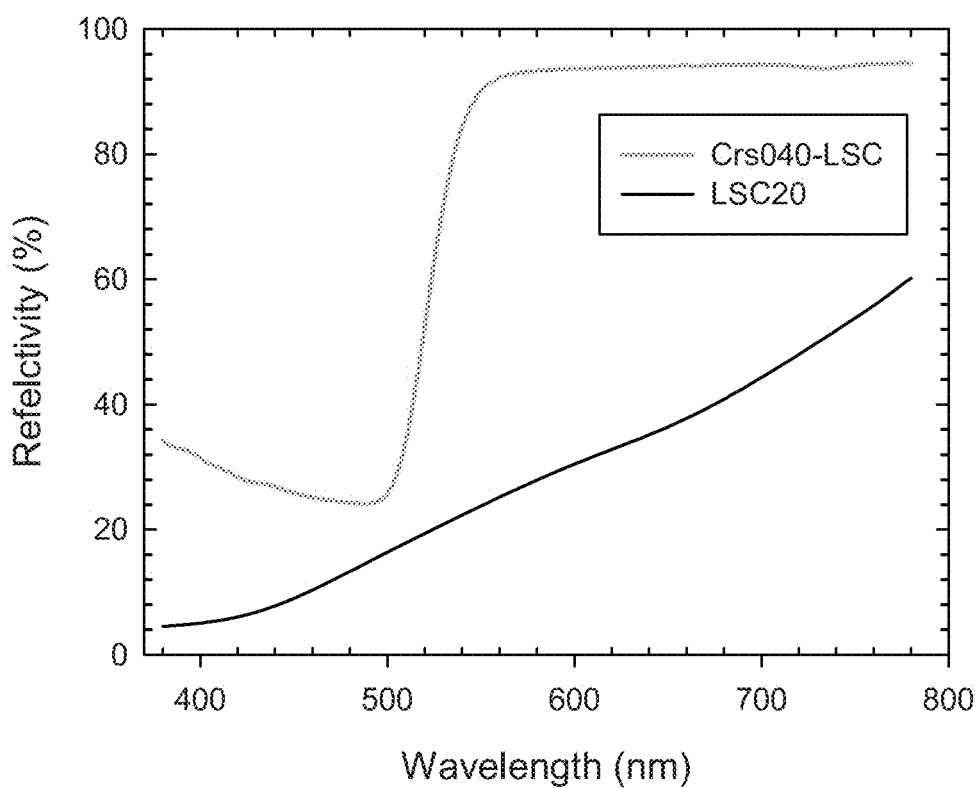
FIG. 25 is a plot of reflectivity versus wavelength, illustrating the reflectance of LSC20 and the LSC incorporating Crs040 Yellow dye. These data are collected using an integrating sphere and placing a Spectralon® scatterer on the back side of the LSCs.
Figure 26:
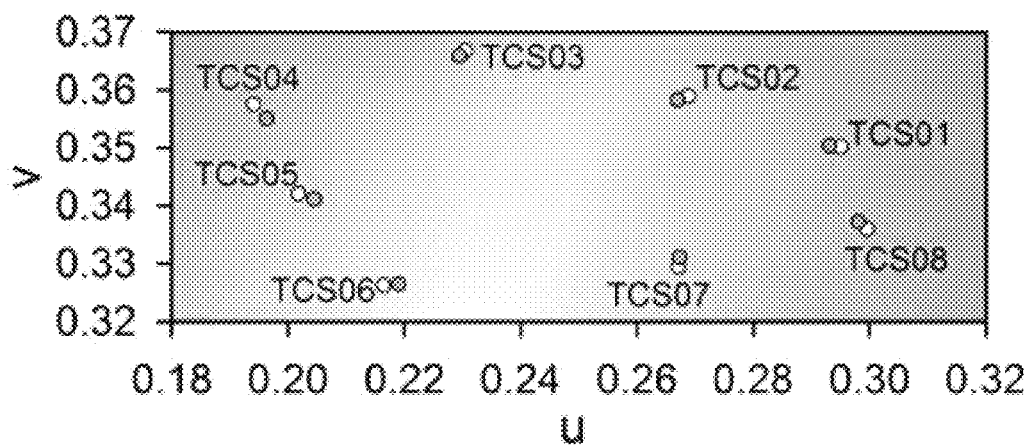
FIG. 26 is a plot illustrating the color coordinates (CIE 1960 Uniform Color Space) of original Munsell test color samples (TCS) under D65 reference illuminant both unfiltered (white circles) and with spectral filtering by LSC20 (brown circles).

The chromatic coordinates in CIE L*a*b* (Commission Internationale de le Éclairage) color space of the LSC20 and Crs040-LSC are shown in FIG. 24. FIG. 25 provides the reflectance spectra of LSC20 and the LSC incorporating Crs040 Yellow dye collected using an integrating sphere, and placing a Spectralon® scatterer on the back side of the LSCs, following the conventional procedure for colorimetric measurements on semitransparent materials. LSC20 exhibited color coordinates L*=56.6, a*=5.1 and b*=32.1, which placed it in the dark brown range of Munsell's color atlas, while the LSC incorporating Crs040 had L*=90.7, a*=3.3 and b*=55.3, corresponding to Munsell brilliant yellow color. In addition to potentially imposing aesthetic constraints to the architectural applicability of LSC technology, color also may determine the type and entity of alteration of the color perception LSCs might cause in individuals living in buildings with LSC-based PV glazing systems. Specifically, partial absorption of the incident solar spectrum by semitransparent colored LSCs may reduce the color rendering index of natural sunlight, resulting in altered colors of indoor settings. In addition, looking through colored LSCs windows may result in filtered chromatic perception of outdoor spaces, with an effect that can be assimilated to artificially induced color blindness (FIGS. 21A-21C). FIG. 26 illustrates the color coordinates (CIE 1960 Uniform Color Space) of original Munsell test color samples (TCS) under D65 (noon daylight) reference illuminant before and after spectral adaptation by LSC20. Remarkably, the coordinates for each TCS illuminated with filtered light are very close to those measured with the unfiltered illuminant, resulting in a total color rendering index $R_a$=90.7, corresponding to CIE color rendering group 1A, which fulfills the highest requirements for indoor illumination (typical applications: galleries, medical examinations, color mixing) and further confirms the color neutrality of our LSCs based on CISeS QDs. For direct comparison, the LSC based on Crs040 Yellow dye has $R_a$=56.6, corresponding to CIE group 3 (suitable for industrial illumination, see FIG. 23C).

Figure 27:
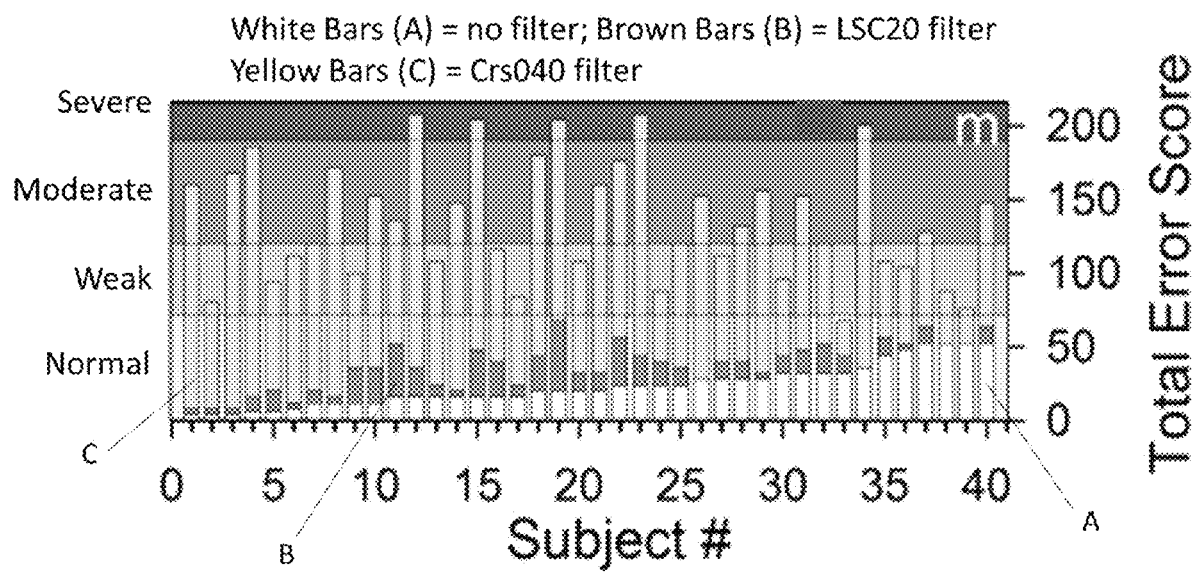
FIG. 27 is a plot of total error score versus subject number, illustrating the results from a Farnsworth-Munsell 100 hue color vision test.

To evaluate the potential alteration of indoor-to-outdoor chromatic perception that could be caused by using the disclosed LSCs as semitransparent PV glazing, Farnsworth-Munsell 100 hue color vision tests were performed on 40 non-color blind subjects between 20 and 55 years of age. In order to account for individual differences in color sensitivity across the whole statistic population, the test was repeated for each subject in identical conditions both without any filter, and by filtering the subject's vision using LSC20 or Crs040-LSCs. The histogram of the total error score (TES) obtained by the tested subjects is reported in FIG. 27, sorted in ascending order by the TES value without filtering (note that the order of tests in the three conditions was chosen randomly across the population to avoid results to be biased by learning effects). By using LSC20, all tested subjects obtained total error scores, TES<70 (median: $<TES_{LSC20}>$=38 vs. $<TES_{No\ Filter}>$=20), corresponding to normal color vision. In contrast, Crs040-LSCs results in significant color distortion ($<TES_{Crs040}>$=156), leading to various degrees of induced color blindness.

It is unclear whether the large Stokes shift $\Delta_s$ is an 'apparent' or 'true' Stoke shift. It can be seen that the absorption spectrum does not fall off sharply past the peak on its low-energy side, but instead shows a long tail, which extend to the center of the PL band (see FIGS. 7, 9 and 13). Such behavior is typical of, for example, Si and Ge QDs or type-II hetero-nanocrystals. In these structures, the band-edge transition is weak as it is indirect either in the momentum or in real space, which leads to the development of a large apparent Stokes shift defined by the energy spacing between the PL band and the first higher-energy strong (typically, direct) optical transition. However, a large Stokes shift could be insufficient to ensure a significant suppression of re-absorption, as a large width of spectral features can still result in considerable overlap between the low-energy tail of the absorption spectrum and the emission profile. In organic molecules in diluted liquid or solid solutions, the spectral linewidth is typically determined by conformational disorder, while, in QDs inhomogeneous broadening is typically due to sample polydispersity. This is the case for CISeS QDs that show residual overlap between emission and absorption bands that can, in principle, be reduced by improving the uniformity of QD sizes.

Figure 28:
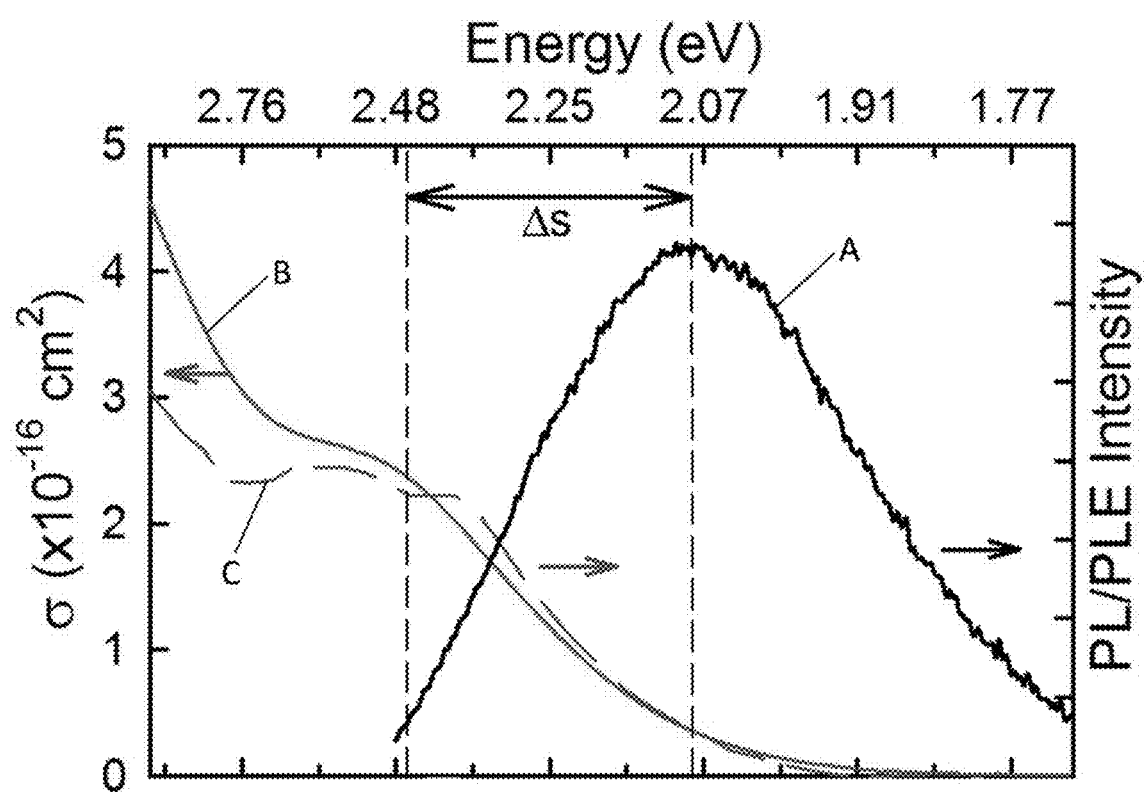
FIG. 28 is a plot of photoluminescence (solid black), absorption (solid red) and photoluminescence excitation (PLE; dashed grey) spectra versus wavelength for 2 nm CIS QDs. In the case of photoluminescence measurements, the QDs are excited at 400 nm (3.1 eV).
Figure 29:
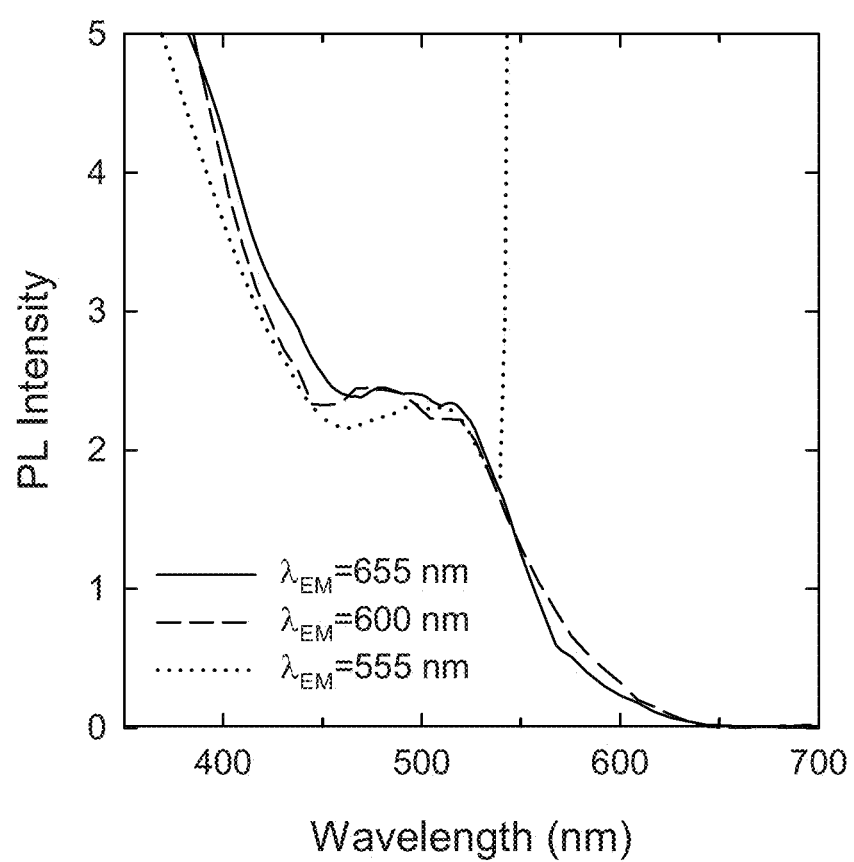
FIG. 29 is a plot of PL intensity versus photoexcitation wavelength, illustrating the photoluminescence excitation spectra (arbitrary units) of 2 nm CIS QDs collected with 2.5 nm bandwidth at 555 nm, 600 nm and 655 nm.
Figure 30:
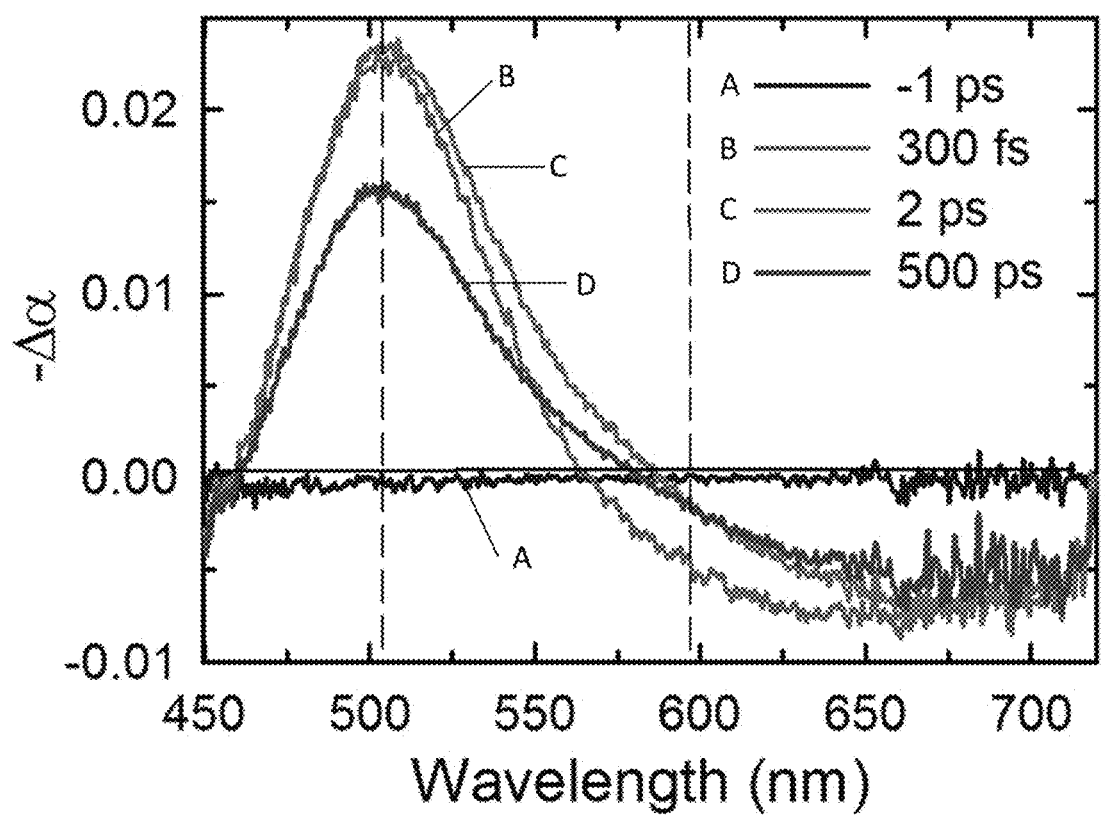
FIG. 30 is a TA spectra of the QDs from FIG. 28, measured at different delays after excitation.
Figure 31:
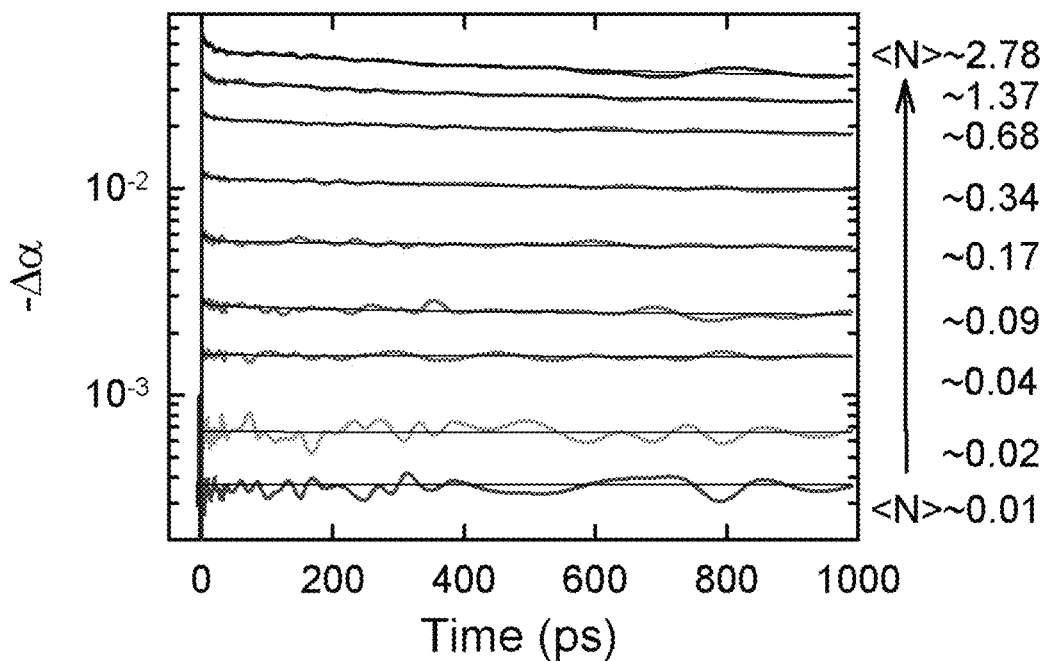
FIG. 31 is a plot illustrating the pump-intensity dependence of TA decay in CIS QDs measured at 500 nm (2.48 eV).

To investigate the light emission mechanism and the nature of a large Stokes shift in I-III-VI$_2$ QDs, spectroscopic studies were performed on QDs of pure CIS composition. In these QDs, the wavelengths of both band-edge absorption and emission fell within the visible spectral range, which can be accessed experimentally using a combination of time-resolved PL and TA techniques. The analysis conducted for CIS QDs should be applicable to CISeS QDs of arbitrary formulations as the main effect of incorporation of Se is lowering PL and absorption energies as a result of the reduced band gap. FIG. 28 illustrates the absorption and emission spectra of a representative CIS QD sample together with its PL excitation (PLE) spectrum collected at the peak PL wavelength. The PL band was centered at 600 nm (2.06 eV), while the first discernible absorption feature was at 500 nm (2.48 eV), which corresponded to a Stokes shift of 410 meV. The PLE spectrum was identical to the absorption spectrum, indicating that the PL was excited via intrinsic electronic transitions of the ternary semiconductor. There was a small yet measurable shift of the PLE spectra collected on the blue and on the red tail of the PL spectrum (555 nm and 655 nm, FIG. 29), which further supported the role of sample polydispersity in determining the emission linewidth. To verify that the absorption peak did correspond to the band-edge transition, TA studies were conducted, in which changes in optical absorption induced by a short 3 eV, 100 fs pump pulse were monitored, with a broad-band probe pulse of a white-light super-continuum. The measured TA spectra were dominated by a bleaching band located exactly at the position of the absorption peak (about 500 nm) (FIG. 30). At low excitation fluences, when the number of photons absorbed per QD per pulse (<N>) was less than unity, this peak remained almost unchanged up to the longest pump-probe delays used in these measurements (~500 ps). FIG. 31 shows the pump-intensity dependence of TA decay in CIS QDs measured at 500 nm (2.48 eV) under excitation with 100 fs, 3.1 eV frequency doubled pulses from an amplified Ti:sapphire laser. The excitation level is shown on the right in terms of the number of photons absorbed per QD per pulse, <N>. This indicated that it is indeed due to saturation (Pauli blocking) of band-edge states where carriers accumulate following intra-band relaxation.

In the case of state filling, the TA amplitude is directly proportional to the sum of the occupation factors of the electron and hole states involved in the optical transition probed in the experiment. Because of large hole effective masses and the complex multi-sub-band structure of the valence band, the density of hole states in I-III-VI$_2$ QDs is much higher than that of the electron states. As a result, single-state occupation factors of valence-band levels are much lower than those of conduction-band levels and hence the TA amplitude is dominated by the contribution from the electrons. This situation is similar to that realized in QDs of II-VI semiconductors such as CdSe where the band-edge bleach has been routinely used to elucidate population build-up and decay of the 1S electron state. Thus the TA studies confirmed that the 500 nm (2.45 eV) feature observed in linear absorption marked the position of the QD band edge and hence a large separation between this feature and the PL band is a "true" and not just an apparent Stokes shift. This further indicated that highly efficient emission from CIS QDs did not arise from the band edge transition but rather was due to a radiative transition involving the band-edge electron level and an intra-gap hole state.

A survey of numerous literature reports indicated a remarkable consistency in the position of the PL band between CIS QD samples prepared by different chemical approaches, which suggested that the hole-like defect responsible for intra-gap emission was likely native to this material's system. One possibility suggested by recent magneto-PL studies is that the intra-gap hole state is associated with the $Cu^{2+}$ ion, which is a common substitutional impurity in II-VI semiconductor where it creates a fairly deep acceptor level. In structural terms, I-III-VI$_2$ semiconductors are ternary analogs of II-VI materials, and their unit cell can be thought of as being comprised of two zinc-blende unit cells distorted along the c-axis. Therefore, it is reasonable to assume that substitutional $Cu^{2+}$ impurities can also occur in I-III-VI$_2$ semiconductors. Based on charge balance considerations, one can think of two $Cu^{2+}$ ions replacing $Cu^{1+}$ and $In^{3+}$ in adjacent sub-cells or $Cu^{2+}$ paired with a $Cu^{+1}$ vacancy, which is a well-known defect in bulk I-III-VI$_2$ materials.

In conclusion, high efficiency large-area LSCs with reduced re-absorption losses based on heavy-metal free IR emitting I-III-VI$_2$ colloidal QDs in a mass polymerized plastic matrix have been demonstrated. The optical transition responsible for light emission in these QDs involves an intra-gap hole states, which leads to a large (ca. 400-500 meV) Stokes shift and greatly reduced losses to re-absorption. By overcoating QDs with a shell of wide gap ZnS, the light emission properties of the QDs were preserved during the entire procedure of their encapsulation into a polymer matrix. Use of these QDs allows many of previous limitations of both organic dyes and colloidal QDs to be overcome, including strong coloring of the LSC and an incomplete coverage of the solar spectrum, which limited the light collection efficiency. As a result, an optical power conversion efficiency of up to 3.2% was obtained, which is the highest reported value for large-area LSCs. Furthermore, the disclosed devices are essentially colorless and do not introduce any significant spectral distortion to transmitted sunlight, which is beneficial for applications such as tinted PV windows.

In some embodiments, the disclosed composition is a substantially transparent composition according to one or more of the following statements:

1. A substantially transparent composition, comprising: a transparent matrix; and plural, substantially non-aggregated heavy metal free nanocrystals substantially homogeneously dispersed in the transparent matrix and separated by a distance greater than an energy transfer distance.

2. The composition of statement 1, wherein the heavy metal free nanocrystals do not comprise cadmium.

3. The composition of statement 1 or statement 2, wherein the heavy metal free nanocrystals do not comprise cadmium, mercury, arsenic or lead.

4. The composition of any one of statements 1-3, wherein the heavy metal free nanocrystals comprise a core and at least one shell.

5. The composition of statement 4, wherein the nanocrystal core has an intrinsically large Stokes shift.

6. The composition of statement 5, wherein the shell does not substantially affect the Stokes shift of the nanocrystal.

7. The composition of statement 4, wherein the shell comprises a shell material and the shell material is selected to enhance the stability of the core, to enable the nanocrystals to be dispersed in a matrix without substantially quenching the quantum yield of the nanocrystals, maintain or improve the photoluminescent intensity of the nanocrystal or a combination thereof.

8. The composition of any one of statements 1-7, wherein the transparent matrix is a matrix transparent to visible light, IR light, UV light, or a combination thereof.

9. The composition of any one of statements 1-8, wherein the transparent matrix is a polymer matrix, sol-gel matrix, glass matrix, solvent matrix or combination thereof.

10. The composition of statement 9, wherein the transparent matrix is a polymer matrix.

11. The composition of statement 10, wherein the polymer matrix comprises a polymer selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof.

12. The composition of statement 10 or statement 11, wherein the polymer matrix comprises an acrylate polymer.

13. The composition of statement 12, wherein the acrylate polymer is made from an acrylate monomer selected from methyl acrylate, ethyl acrylate, propyl acrylate, butyl acrylate, pentyl acrylate, hexyl acrylate, octyl acrylate, nonyl acrylate, decyl acrylate dodecyl acrylate, 2-chloroethyl acrylate, methyl methacrylate, ethyl methacrylate, butyl methacrylate, pentyl methacrylate, hexyl methacrylate, octyl methacrylate, nonyl methacrylate, decyl methacrylate, lauryl methacrylate, 2-ethylhexyl acrylate, hydroxyethyl methacrylate, trimethylolpropane triacrylate or a combination thereof.

14. The composition of statement 12, wherein the acrylate polymer comprises polylauryl methacrylate.

15. The composition of any one of statements 1-14, wherein the nanocrystal comprises zinc sulfide (ZnS), zinc selenide (ZnSe), zinc oxide (ZnO), zinc telluride (ZnTe), aluminum nitride (AlN), aluminum sulfide (AlS), aluminum phosphide (AlP), aluminum antimonide (AlSb), gallium nitride (GaN), gallium phosphide (GaP), gallium antimonide (GaSb), indium nitride (InN), indium phosphide (InP), indium antimonide (InSb), thallium nitride (TlN), thallium phosphide (TlP), thallium antimonide (TlSb), indium gallium nitride (InGaN), indium gallium phosphide (InGaP), aluminum indium nitride (AlInN), indium aluminum phosphide (InAlP), aluminum gallium phosphide (AlGaP), aluminum indium gallium nitride (AlInGaN), silver indium selenide sulfide ($AgInSe_xS_{2-x}$), gold indium selenide sulfide ($AuInSe_xS_{2-x}$), copper aluminum selenide sulfide ($CuAlSe_xS_{2-x}$), copper gallium selenide sulfide ($CuGaSe_xS_{2-x}$), silver indium selenide ($AgInSe_2$), gold indium sulfide ($AuInS_2$), copper aluminum selenide ($CuAlSe_2$), copper gallium selenide ($CuGaSe_2$), copper indium selenide sulfide ($CuInSe_xS_{2-x}$), Si, Ge, Sn, SiGe, SiSn, GeSn, aluminum (Al), gold (Au), silver (Ag), cobalt (Co), iron (Fe), nickel (Ni), copper (Cu), gallium, silicon, manganese (Mn), indium, selenium, sulfur or combinations thereof.

16. The composition of any one of statements 1-15, wherein the nanocrystal comprises InSb, InP, Ge, Si, Sn, Sn, InN, AlN, GaN, ZnTe, ZnSe, ZnS, ZnO, $AgInSe_xS_{2-x}$, $AuInSe_xS_{2-x}$, $CuAlSe_xS_{2-x}$, $CuGaSe_xS_{2-x}$, or $CuInSe_xS_{2-x}$, where x is from 0 to 2, or combinations thereof.

17. The composition of any one of statements 4-16, wherein the nanocrystal core comprises InSb, InP, Ge, Si, Sn, Sn, InN, AlN, GaN, ZnTe, ZnSe, ZnS, ZnO, $AgInSe_xS_{2-x}$, $AuInSe_xS_{2-x}$, $CuAlSe_xS_{2-x}$, $CuGaSe_xS_{2-x}$, or $CuInSe_xS_{2-x}$, where x is from 0 to 2, or combinations thereof.

18. The composition of any one of statements 4-17, wherein the nanocrystal shell comprises InSb, InP, Ge, Si, Sn, Sn, InN, AlN, GaN, ZnTe, ZnSe, ZnS, or ZnO, $AgInSe_xS_{2-x}$, $AuInSe_xS_{2-x}$, $CuAlSe_xS_{2-x}$, $CuGaSe_xS_{2-x}$, or $CuInSe_xS_{2-x}$, or combinations thereof.

19. The composition of any one of statements 4-18, wherein the nanocrystal has a core/shell structure selected from InP/ZnSe, InSb/ZnSe, InP/ZnS, InSb/ZnS, Ge/Si, Si/Ge, Sn/Si, Si/Sn, Ge/Sn, Sn/Ge, $AgInSe_xS_{2-x}$/ZnS, $AuInSe_xS_{2-x}$/ZnS, $CuAlSe_xS_{2-x}$/ZnS, $CuGaSe_xS_{2-x}$/ZnS, $CuInSe_xS_{2-x}$/$CuInS_2$, $CuInSe_xS_{2-x}$/$AuGaS_2$, or $CuInSe_xS_{2-x}$/ZnS, where x is from 0 to 2.

20. The composition of any one of statements 1-19, wherein the nanocrystal comprises $CuInS_2$, $CuInSe_{0.1}S_{1.9}$, $CuInSe_{0.2}S_{1.8}$, $CuInSe_{0.25}S_{1.75}$, $CuInSe_{0.3}S_{1.7}$, $CuInSe_{0.4}S_{1.6}$, $CuInSe_{0.5}S_{1.5}$, $CuInSe_{0.6}S_{1.4}$, $CuInSe_{0.7}S_{1.3}$, $CuInSe_{0.75}S_{1.25}$, $CuInSe_{0.8}S_{1.2}$, $CuInSe_{0.9}S_{1.1}$, CuInSeS, $CuInSe_{1.1}S_{0.9}$, $CuInSe_{1.2}S_{0.8}$, $CuInSe_{1.25}S_{0.75}$, $CuInSe_{1.3}S_{0.7}$, $CuInSe_{1.4}S_{0.6}$, $CuInSe_{1.5}S_{0.5}$, $CuInSe_{1.6}S_{0.4}$, $CuInSe_{1.7}S_{0.3}$, $CuInSe_{1.75}S_{0.25}$, $CuInSe_{1.8}S_{0.2}$, $CuInSe_{1.9}S_{0.1}$, $CuInSe_2$ or a combination thereof.

21. The composition of any one of statements 1-20, wherein the nanocrystals have a shape selected from a sphere, rod, tetrapod, heteronanorod, hetero-platelet, hetero-tripod, hetero-tetrapod, hetero-hexapod, dot-in-rod, dot-in-platelet, rod-in-rod and platelet-in-platelet, dot-in-bulk, complex branched hetero-structure, or a combination thereof.

22. The composition of statement 5, wherein global Stokes shift is greater than 200 meV.

23. The composition of any one of statements 1-22, wherein the nanocrystal concentration in the transparent matrix of from greater than zero wt % to 10 wt % relative to the weight of the transparent matrix.

24. The composition of statement 23, wherein the nanocrystal concentration is from greater than zero wt % to 0.5 wt %.

25. The composition of statement 24, wherein the nanocrystal concentration is from 0.1 wt % to 0.2 wt %.

26. The composition of any one of statements 1-25, wherein the nanocrystals are dispersed in the transparent matrix such than a nanocrystal emission efficiency drops by less than 10% compared to a nanocrystal emission efficiency of nanocrystals dissolved in a solvent.

27. The composition of statement 26, wherein the nanocrystal emission efficiency drops by less than 5%.

28. The composition of statement 26, wherein the nanocrystal emission efficiency drops by less than 1%.

29. The composition of any one of statements 1-28, wherein the composition is substantially colorless.

30. The composition of statement 29, wherein the composition has a color rendering index of from 80 to 100.

31. The composition of statement 30, wherein the color rendering index is from 90 to 100.

32. The composition of any one of statements 1-31, wherein the composition is a composition that absorbs at least 10% of incident solar light.

33. The composition of any one of statements 1-31, wherein the composition has an optical power conversion ratio of greater than 1%.

34. The composition of any one of statements 1-33, wherein the nanocrystals have a core/shell structure of $CuInSe_xS_{2-x}$/ZnS, where x is from greater than 0 to less than 2.

35. A composition substantially transparent to visible light, IR light, UV light, or a combination thereof, the composition, comprising:
a polymer matrix wherein the polymer is selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof; and
plural, substantially non-aggregated heavy metal free nanocrystals substantially homogeneously dispersed in the polymer matrix at a concentration of from greater than zero wt % to 1 wt % relative to the weight of the polymer matrix such that a nanocrystal emission efficiency drops by less than 10% compared to a quantum dot emission efficiency of nanocrystals dissolved in a solvent, the core/shell structure being selected from InP/ZnSe, InSb/ZnSe, InP/ZnS, InSb/ZnS, Ge/Si, Si/Ge, Sn/Si, Si/Sn, Ge/Sn, Sn/Ge, $AgInSe_xS_{2-x}$/ZnS, $AuInSe_xS_{2-x}$/ZnS, $CuAlSe_xS_{2-x}$/ZnS, $CuGaSe_xS_{2-x}$/ZnS, $CuInSe_xS_{2-x}$/$CuInS_2$, $CuInSe_xS_{2-x}$/$AuGaS_2$, or $CuInSe_xS_{2-x}$/ZnS, where x is from 0 to 2, the nanocrystals having a global Stokes shift of greater than 200 meV and being separated by a distance greater than an energy transfer distance;
wherein the composition has a color rendering index of from 90 to 100.

Also disclosed herein are embodiments of a device according to one or more of the following statements:

36. A device, comprising a substantially colorless, transparent composition comprising a transparent matrix comprising plural, substantially non-aggregated heavy metal free nanocrystals substantially homogeneously dispersed in the transparent matrix and separated by a distance greater than an energy transfer distance, the nanocrystals comprising a core and at least one shell about the core.

37. The device of statement 36, wherein the nanocrystals dispersed in the transparent matrix have a quantum yield of from greater than 0 to 90%.

38. The device of statement 37, wherein the photoluminescence quantum yield is from 10% to 80%.

39. The device of statement 37, wherein the photoluminescence quantum yield is from 10% to 50%.

40. The device of any one of statements 36-39, wherein the transparent matrix is a matrix transparent or semi-transparent to visible light, infrared light, ultraviolet light or a combination thereof.

41. The device of any one of statements 36-40, wherein the device comprises a transparent substrate at least partially coated with a film comprising the composition.

42. The device of statement 41, wherein the transparent substrate is a glass substrate.

43. The device of any one of statements 36-40, wherein the device comprised a polymer matric comprising the nanocrystals.

44. The device of any one of statements 36-43, further comprising a photovoltaic.

45. The device of any one of statements 36-44, further comprising a reflector and/or a diffuser.

46. The device of any one of statements 36-45, wherein the device is a window.

47. The device of statement 46, wherein the window comprises at least one window pane comprising the composition.

48. The device of statement 46, wherein the window comprises at least one window pane at least partially coated with a film comprising the composition.

49. The device of statement 46, wherein the window comprises at least two window panes and the composition is positioned between the window panes.

50. The device according to statement 36 wherein the composition comprises:

a polymer matrix wherein the polymer is selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof; and plural, substantially non-aggregated heavy metal free nanocrystals substantially homogeneously dispersed in the polymer matrix at a concentration of from greater than zero wt % to 1 wt % relative to the weight of the polymer matrix such that a nanocrystal emission efficiency drops by less than 10% compared to a nanocrystal emission efficiency of nanocrystals dissolved in a solvent, the core/shell structure being selected from InP/ZnSe, InSb/ZnSe, InP/ZnS, InSb/ZnS, Ge/Si, Si/Ge, Sn/Si, Si/Sn, Ge/Sn, Sn/Ge, AgInSe$_x$S$_{2-x}$/ZnS, AuInSe$_x$S$_{2-x}$/ZnS, CuAlSe$_x$S$_{2-x}$/ZnS, CuGaSe$_x$S$_{2-x}$/ZnS, CuInSe$_x$S$_{2-x}$/CuInS$_2$, CuInSe$_x$S$_{2-x}$/AuGaS$_2$, or CuInSe$_x$S$_{2-x}$/ZnS, where x is from 0 to 2, the nanocrystals having a global Stokes shift of greater than 200 meV and being separated by a distance greater than an energy transfer distance.

51. The device of any one of statements 36-50, wherein the nanocrystals have a core/shell structure of CuInSe$_x$S$_{2-x}$/ZnS, where x is from 0 to 2.

52. The device of statement 51, wherein the nanocrystal core comprises CuInS$_2$, CuInSe$_{0.1}$S$_{1.9}$, CuInSe$_{0.2}$S$_{1.8}$, CuInSe$_{0.25}$S$_{1.75}$, CuInSe$_{0.3}$S$_{1.7}$, CuInSe$_{0.4}$S$_{1.6}$, CuInSe$_{0.5}$S$_{1.5}$, CuInSe$_{0.6}$S$_{1.4}$, CuInSe$_{0.7}$S$_{1.3}$, CuInSe$_{0.75}$S$_{1.25}$, CuInSe$_{0.8}$S$_{1.2}$, CuInSe$_{0.9}$S$_{1.1}$, CuInSeS, CuInSe$_{1.1}$S$_{0.9}$, CuInSe$_{1.2}$S$_{0.8}$, CuInSe$_{1.25}$S$_{0.75}$, CuInSe$_{1.3}$S$_{0.7}$, CuInSe$_{1.4}$S$_{0.6}$, CuInSe$_{1.5}$S$_{0.5}$, CuInSe$_{1.6}$S$_{0.4}$, CuInSe$_{1.7}$S$_{0.3}$, CuInSe$_{1.75}$S$_{0.25}$, CuInSe$_{1.8}$S$_{0.2}$, CuInSe$_{1.9}$S$_{0.1}$, CuInSe$_2$ or a combination thereof.

53. The device of any one of statements 36-52, wherein the device has a color rendering index of from 80 to 100.

54. A building or transportation device having at least one window comprising a substantially colorless composition comprising a transparent matrix and plural, substantially non-aggregated heavy metal free nanocrystals substantially homogeneously dispersed in the transparent matrix and separated by a distance greater than an energy transfer distance, the nanocrystals comprising a core and at least one shell about the core.

55. The building or transportation device according to statement 54 wherein the composition comprises:

a polymer matrix wherein the polymer is selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof; and plural, substantially non-aggregated heavy metal free nanocrystals substantially homogeneously dispersed in the polymer matrix at a concentration of from greater than zero wt % to 1 wt % relative to the weight of the polymer matrix such that a nanocrystal emission efficiency drops by less than 10% compared to a quantum dot emission efficiency of nanocrystals dissolved in a solvent, the core/shell structure being selected from InP/ZnSe, InSb/ZnSe, InP/ZnS, InSb/ZnS, Ge/Si, Si/Ge, Sn/Si, Si/Sn, Ge/Sn, Sn/Ge, AgInSe$_x$S$_{2-x}$/ZnS, AuInSe$_x$S$_{2-x}$/ZnS, CuAlSe$_x$S$_{2-x}$/ZnS, CuGaSe$_x$S$_{2-x}$/ZnS, CuInSe$_x$S$_{2-x}$/CuInS$_2$, CuInSe$_x$S$_{2-x}$/AuGaS$_2$, or CuInSe$_x$S$_{2-x}$/ZnS, where x is from 0 to 2, the nanocrystals having a global Stokes shift of greater than 200 meV and being separated by a distance greater than an energy transfer distance.

56. The device of statement 55, wherein the nanocrystals have a core/shell structure of CuInSe$_x$S$_{2-x}$/ZnS, where x is from 0 to 2.

57. The device of statement 56, wherein the nanocrystal core comprises CuInS$_2$, CuInSe$_{0.1}$S$_{1.9}$, CuInSe$_{0.2}$S$_{1.8}$, CuInSe$_{0.25}$S$_{1.75}$, CuInSe$_{0.3}$S$_{1.7}$, CuInSe$_{0.4}$S$_{1.6}$, CuInSe$_{0.5}$S$_{1.5}$, CuInSe$_{0.6}$S$_{1.4}$, CuInSe$_{0.7}$S$_{1.3}$, CuInSe$_{0.75}$S$_{1.25}$, CuInSe$_{0.8}$S$_{1.2}$, CuInSe$_{0.9}$S$_{1.1}$, CuInSeS, CuInSe$_{1.1}$S$_{0.9}$, CuInSe$_{1.2}$S$_{0.8}$, CuInSe$_{1.25}$S$_{0.75}$, CuInSe$_{1.3}$S$_{0.7}$, CuInSe$_{1.4}$S$_{0.6}$, CuInSe$_{1.5}$S$_{0.5}$, CuInSe$_{1.6}$S$_{0.4}$, CuInSe$_{1.7}$S$_{0.3}$, CuInSe$_{1.75}$S$_{0.25}$, CuInSe$_{1.8}$S$_{0.2}$, CuInSe$_{1.9}$S$_{0.1}$, CuInSe$_2$ or a combination thereof.

58. The building or transportation device according to any one of statements 54-57, wherein the transportation device is an automobile, ship or airplane.

Additionally, disclosed herein are embodiments of a method, according to one or more of the following statements:

59. A method for making a composition, comprising:

dispersing heavy metal free nanocrystals in a first amount of a monomer and a first polymerization initiator to form a dispersion of quantum dots in monomer;

mixing the dispersion of quantum dots in monomer with a second amount of the monomer and an initiator to form a mixture;

agitating the mixture; and initiating polymerization of the monomer to form the composition comprising a transparent matrix with quantum dots dispersed within.

60. The method of statement 59, wherein the transparent matrix comprises a polymer selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof.

61. The method of statement 60, wherein the monomer is an acrylate monomer.

62. The method of statement 61, wherein the acrylate monomer is selected from methyl acrylate, ethyl acrylate, propyl acrylate, butyl acrylate, pentyl acrylate, hexyl acrylate, octyl acrylate, nonyl acrylate, decyl acrylate dodecyl acrylate, 2-chloroethyl acrylate, methyl methacrylate, ethyl methacrylate, butyl methacrylate, pentyl methacrylate, hexyl methacrylate, octyl methacrylate, nonyl methacrylate, decyl methacrylate, lauryl methacrylate, 2-ethylhexyl acrylate, hydroxyethyl methacrylate, trimethylolpropane triacrylate or a combination thereof.

63. The method of statement 61, wherein the acrylate monomer comprises lauryl methacrylate.

64. The method of any one of statement 59-63, wherein the initiator is a radical initiator, and initiating polymerization comprises irradiating the mixture.

65. The method of any one of statements 59-64, wherein the initiator is 2,2-dimethoxy-1,2-diphenylethan-1-one.

66. The method of any one of statements 59-65, wherein the mixture further comprises a cross-linking agent.

67. The method of statement 66, wherein the cross-linking agent comprises ethylene glycol dimethacrylate.

68. The method of any one of statements 59-67, wherein agitating the mixture comprises stirring the mixture, sonicating the mixture, shaking the mixture, or a combination thereof.

69. The method of any one of statements 59-68, further comprising allowing the polymerization to proceed in the dark.

Furthermore, disclosed herein are embodiments of a product according to one or more of the flowing statements:

70. A product made by any of method statements 59-59.

71. The product according to statement 70 wherein the product is a window.

72. The product according to statement 71 wherein the window is in a building or transportation device.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A luminescent solar concentrator composition, comprising:

optically clear matrix; and plural, substantially non-aggregated nanocrystals having a core/shell structure of $CuInSe_xS_{2-x}$/ZnS, where x is from 0 to 2, the nanocrystals being substantially homogeneously dispersed in the optically clear matrix and separated by a distance greater than an energy transfer distance, thereby forming an optically clear luminescent solar concentrator having a color rendering index of 80 to 100 and a lightness (L*) value of 60 or less.

2. The composition of claim 1, wherein x is from greater than 0 to less than 2.

3. The composition of claim 1, wherein the nanocrystals are separated by a distance of greater than 20 nm.

4. The composition of claim 1, wherein the optically clear matrix is a polymer matrix, sol-gel matrix, glass matrix, solvent matrix, or combination thereof.

5. The composition of claim 1, wherein the optically clear matrix is a polymer matrix comprising a polymer selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine, or combinations thereof.

6. The composition of claim 5, wherein the polymer matrix comprises an acrylate polymer.

7. The composition of claim 6, wherein the acrylate polymer comprises polylauryl methacrylate.

8. The composition of claim 1, wherein a concentration of nanocrystals in the optically clear matrix is from greater than zero wt % to 10 wt % relative to the weight of the optically clear matrix.

9. The composition of claim 1, wherein the nanocrystals are dispersed in the optically clear matrix such than a nanocrystal emission efficiency drops by less than 10% compared to a nanocrystal emission efficiency of nanocrystals dissolved in a solvent.

10. The composition of claim 1, wherein the composition has an optical power conversion ratio of greater than 1%, absorbs at least 10% of incident solar light, or a combination thereof.

11. The composition of claim 1, wherein the composition comprises:

a polymer matrix wherein the polymer is selected from poly acrylate, poly methacrylate, polyolefin, poly vinyl, epoxy resin, polycarbonate, polyacetate, polyamide, polyurethane, polyketone, polyester, polycyanoacrylate, silicone, polyglycol, polyimide, fluorinated polymer, polycellulose, poly oxazine or combinations thereof; and plural, substantially non-aggregated $CuInSe_xS_{2-x}$/ZnS core/shell nanocrystals substantially homogeneously dispersed in the polymer matrix at a concentration of from greater than zero wt % to 1 wt % relative to the weight of the polymer matrix such that a nanocrystal emission efficiency drops by less than 10% compared to a quantum dot emission efficiency of nanocrystals dissolved in a solvent, the nanocrystals having a global Stokes shift of greater than 200 meV and being separated by a distance greater than 20 nm;

wherein the composition is substantially transparent to visible light, IR light, UV light, or a combination thereof, substantially colorless, and has a color rendering index of from 90 to 100.

12. A device, comprising the composition of claim 1.

13. The device of claim 12, wherein the optically clear matrix is a matrix transparent or semi-transparent to visible light, infrared light, ultraviolet light or a combination thereof.

14. The device of claim 12, comprising a transparent substrate at least partially coated with a film comprising the composition.

15. The device of claim 14, wherein the transparent substrate is a glass substrate.

16. The device of claim 12, further comprising a photovoltaic cell, a reflector, a diffuser, or a combination thereof.

17. The device of claim 12, wherein the device is a window.

18. The device of claim 17, wherein the window comprises at least one window pane comprising the composition, at least one window pane at least partially coated with a film comprising the composition, at least two window panes with the composition positioned between the window panes, or a combination thereof.

19. The composition of claim 1, wherein the optically clear matrix has negligibly small light scattering.

20. A luminescent solar concentrator composition, comprising:
   a polymer matrix; and
   a plurality of substantially non-aggregated nanocrystals having a core/shell structure of $CuInSe_xS_{2-x}/ZnS$, where x is from 0 to 2, the nanocrystals being substantially homogeneously dispersed in the matrix and separated by a distance greater than an energy transfer distance, thereby having negligibly small light scattering, the luminescent solar concentrator having a color rendering index of 80 to 100 and a lightness ($L^*$) value of 60 or less.

* * * * *